US007598726B1

(12) United States Patent
Tabatabaei

(10) Patent No.: US 7,598,726 B1
(45) Date of Patent: Oct. 6, 2009

(54) METHODS AND APPARATUSES FOR TEST METHODOLOGY OF INPUT-OUTPUT CIRCUITS

(75) Inventor: Sassan Tabatabaei, Sunnyvale, CA (US)

(73) Assignee: Virage Logic Corporation, Fremont, CA (US)

( * ) Notice: Subject to any disclaimer, the term of this patent is extended or adjusted under 35 U.S.C. 154(b) by 0 days.

(21) Appl. No.: 11/510,035

(22) Filed: Aug. 24, 2006

Related U.S. Application Data

(60) Provisional application No. 60/716,386, filed on Sep. 12, 2005.

(51) Int. Cl.
G01R 31/28 (2006.01)

(52) U.S. Cl. .................................. 324/158.1; 714/721

(58) Field of Classification Search .............. 324/158.1; 714/721
See application file for complete search history.

(56) References Cited

U.S. PATENT DOCUMENTS

| | | | |
|---|---|---|---|
| 5,062,122 A | 10/1991 | Pham et al. | |
| 5,670,890 A | 9/1997 | Colwell et al. | |
| 5,915,105 A | 6/1999 | Farmwald et al. | |
| 5,923,676 A | 7/1999 | Sunter et al. | |
| 5,954,804 A | 9/1999 | Farmwald et al. | |
| 5,995,443 A | 11/1999 | Farmwald et al. | |
| 6,011,732 A | 1/2000 | Harrison et al. | |
| 6,032,214 A | 2/2000 | Farmwald et al. | |
| 6,035,365 A | 3/2000 | Farmwald et al. | |
| 6,044,426 A | 3/2000 | Farmwald et al. | |
| 6,049,846 A | 4/2000 | Farmwald et al. | |
| 6,085,284 A | 7/2000 | Farmwald et al. | |
| 6,100,735 A | 8/2000 | Lu | |
| 6,101,152 A | 8/2000 | Farmwald et al. | |
| 6,107,826 A | 8/2000 | Young et al. | |
| 6,166,563 A * | 12/2000 | Volk et al. ................... 326/87 |
| 6,173,432 B1 | 1/2001 | Harrison | |
| 6,260,163 B1 * | 7/2001 | Lacroix et al. .............. 714/726 |
| 6,260,263 B1 | 7/2001 | Haase | |
| 6,262,585 B1 | 7/2001 | Frodsham et al. | |
| 6,348,811 B1 | 2/2002 | Haycock et al. | |
| 6,348,826 B1 | 2/2002 | Mooney et al. | |
| 6,397,361 B1 | 5/2002 | Saitoh | |
| 6,405,335 B1 | 6/2002 | Whetsel | |
| 6,421,801 B1 | 7/2002 | Maddux et al. | |
| 6,425,097 B1 | 7/2002 | Elachkar et al. | |
| 6,429,715 B1 | 8/2002 | Bapat et al. | |
| 6,445,231 B1 | 9/2002 | Baker et al. | |
| 6,449,738 B1 | 9/2002 | Hinedi et al. | |

(Continued)

OTHER PUBLICATIONS

Adham, Saman, et al., "Preliminary Outline of the IEEE P1500 Scaleable Architecture for Testing Embedded Cores," IEEE P1500 Architecture Task Force, 1999, 6 pages.

(Continued)

*Primary Examiner*—Ha Tran T Nguyen
*Assistant Examiner*—Shaun Campbell
(74) *Attorney, Agent, or Firm*—Rutan & Tucker LLP

(57) ABSTRACT

Various methods and apparatuses are described for a system that includes some on-chip components, e.g., I/Os, test processors, soft wrappers, etc., an external testing unit that provides Parametric Measurement Unit (PMU) capability, a Device Interface Board (DIB) that includes resistors between the chip and the external tester, and various tests performed on the I/Os by the on-chip testing logic and external testing unit facilitated through the DIB.

24 Claims, 9 Drawing Sheets

U.S. PATENT DOCUMENTS

| | | | |
|---|---|---|---|
| 6,452,432 B2 | 9/2002 | Kim | |
| 6,476,652 B1 | 11/2002 | Lee et al. | |
| 6,477,674 B1 | 11/2002 | Bates et al. | |
| 6,483,360 B2 | 11/2002 | Nakamura | |
| 6,486,919 B1 | 11/2002 | Kim | |
| 6,492,798 B2 | 12/2002 | Sunter | |
| 6,492,851 B2 | 12/2002 | Watarai | |
| 6,502,050 B1 | 12/2002 | Chan | |
| 6,580,304 B1 | 6/2003 | Rieven | |
| 6,586,921 B1 * | 7/2003 | Sunter | 324/76.11 |
| 6,629,274 B1 | 9/2003 | Tripp et al. | |
| 6,639,426 B2 | 10/2003 | Haycock et al. | |
| 6,657,936 B2 | 12/2003 | Harvey et al. | |
| 6,658,613 B2 | 12/2003 | Rearick et al. | |
| 6,671,847 B1 | 12/2003 | Chao et al. | |
| 6,691,269 B2 | 2/2004 | Sunter | |
| 6,694,464 B1 | 2/2004 | Quayle et al. | |
| 6,721,920 B2 | 4/2004 | Rearick et al. | |
| 6,731,128 B2 | 5/2004 | Das et al. | |
| 6,748,549 B1 | 6/2004 | Chao et al. | |
| 6,750,688 B2 | 6/2004 | Takai | |
| 6,754,613 B2 | 6/2004 | Tabatabaei et al. | |
| 6,760,873 B1 | 7/2004 | Hao et al. | |
| 6,760,899 B1 | 7/2004 | Young et al. | |
| 6,774,694 B1 | 8/2004 | Stern et al. | |
| 6,777,995 B1 | 8/2004 | Harrison | |
| 6,823,502 B2 | 11/2004 | Wingren et al. | |
| 6,839,860 B2 | 1/2005 | Lin | |
| 6,857,080 B1 | 2/2005 | Liang | |
| 6,865,135 B2 | 3/2005 | Choi | |
| 6,900,679 B2 | 5/2005 | Watarai | |
| 6,914,852 B2 | 7/2005 | Choi | |
| 6,934,215 B2 | 8/2005 | Chung et al. | |
| 7,161,397 B2 | 1/2007 | Lee et al. | |
| 7,199,625 B1 | 4/2007 | Chung | |
| 7,202,719 B2 | 4/2007 | Gabato et al. | |
| 7,219,282 B2 | 5/2007 | Sunter et al. | |
| 7,254,729 B2 | 8/2007 | Matsushima et al. | |
| 7,256,600 B2 * | 8/2007 | Walker et al. | 324/763 |
| 7,262,623 B1 * | 8/2007 | Mark et al. | 324/765 |
| 2001/0024135 A1 | 9/2001 | Harrison | |
| 2001/0026183 A1 | 10/2001 | Kim | |
| 2001/0030553 A1 * | 10/2001 | Aihara | 324/765 |
| 2001/0035784 A1 | 11/2001 | Watarai | |
| 2002/0015460 A1 | 2/2002 | Bhullar et al. | |
| 2002/0027461 A1 | 3/2002 | Kusunoki | |
| 2002/0036526 A1 | 3/2002 | Nakamura | |
| 2002/0041196 A1 | 4/2002 | Demone et al. | |
| 2002/0057624 A1 | 5/2002 | Manning | |
| 2002/0153914 A1 | 10/2002 | Arabi et al. | |
| 2002/0154723 A1 | 10/2002 | Nakamura | |
| 2002/0157031 A1 | 10/2002 | Lin | |
| 2003/0001638 A1 | 1/2003 | Watarai | |
| 2003/0005374 A1 | 1/2003 | Fought et al. | |
| 2003/0030461 A1 | 2/2003 | Oberle et al. | |
| 2003/0067333 A1 | 4/2003 | Nakamura | |
| 2003/0071606 A1 | 4/2003 | Sunter | |
| 2003/0099321 A1 | 5/2003 | Juan et al. | |
| 2003/0151433 A1 | 8/2003 | Takai | |
| 2003/0196153 A1 | 10/2003 | Evans | |
| 2003/0199262 A1 | 10/2003 | Chung | |
| 2003/0208708 A1 | 11/2003 | Sunter | |
| 2004/0027993 A1 | 2/2004 | Ghiasi et al. | |
| 2004/0051551 A1 | 3/2004 | Sunter | |
| 2004/0062121 A1 | 4/2004 | Chung et al. | |
| 2004/0098648 A1 | 5/2004 | Sunter | |
| 2004/0109464 A1 | 6/2004 | Seo et al. | |
| 2004/0119455 A1 | 6/2004 | Sunter | |
| 2004/0123197 A1 | 6/2004 | Sunter | |
| 2004/0153931 A1 | 8/2004 | Cao et al. | |
| 2004/0179640 A1 | 9/2004 | Jacob et al. | |
| 2004/0186675 A1 * | 9/2004 | Larson et al. | 702/91 |
| 2004/0196064 A1 | 10/2004 | Garlepp et al. | |
| 2004/0221197 A1 | 11/2004 | Goyal et al. | |
| 2004/0223571 A1 | 11/2004 | Donnelly et al. | |
| 2004/0246017 A1 | 12/2004 | Arabi et al. | |
| 2005/0007157 A1 | 1/2005 | Harrison | |
| 2005/0025190 A1 | 2/2005 | Frisch | |

OTHER PUBLICATIONS

Arkin, Brian, "Realizing a Production ATE Custom Processor and Timing IC Containing 400 Independent Low-Power and High-Linearity Timing Verniers," IEEE International Solid-State Circuits Conference, Feb. 2004.

Bonnett, David, "IEEE 1149.1 yields new standards," Test & Measurement World, http://www.reed-electronics.com/tmworld/article/CA202501.html, Apr. 2002.

Christiansen, Jorgen, "An Integrated High Resolution CMOS Timing Generator Based on an Array of Delay Locked Loops," IEEE Journal of Solid State Circuits, Jul. 1996, pp. 952-957, 31:7.

Gillis, Pamela, et al, "Delay Test of Chip I/Os Using LSSD Boundary Scan," IEEE International Test Conference, Aug. 1998, pp. 83-90, Paper 4.1.

Hwang, Chorng-Sii, et al, "A High-Precision Time-to-Digital Converter Using a Two-Level Conversion Scheme," IEEE Transactions on Nuclear Science, Aug. 2004, pp. 1349-1352, 51:4.

Kuo, Andy, et al, "Jitter Models and Measurement Methods for High-Speed Serial Interconnects," ITC International Test Conference, Feb. 2004, pp. 1295-1302, Paper 46.1.

Kuo, Andy, et al, "Crosstalk Bounded Uncorrelated Jitter (BUJ) for High-Speed Interconnects," IEEE Transactions on Instrumentation and Measurement, Oct. 2005, pp. 1800-1810, 54:5.

Mantyniemi, Antti, et al, "A High Resolution Digital CMOS Time-to-Digital Converter Based on Nested Delay Locked Loops," IEEE, 1999, pp. 537-540.

Nelson, Rick, "PCB test: nails or TAP?" http://www.reed-electronics.com/tmworld/article/CA239852.html, Sep. 2002.

Ou, Nelson, et al, "Jitter Models for Design and Test of Gbps-Speed Serial Interconnects," IEEE Design & Test of Computers, IEEE Design & Test of Computers, Jul.-Aug. 2004, pp. 302-313.

Santos, Dinis M, et al, "A CMOS Delay Locked Loop and Sub-Nanosecond Time-to-Digital Converter Chip," 1996, pp. 289-291.

Sunter, Stephen K, et al, "Complete, Contactless I/O Testing—Reaching the Boundary in Minimizing Digital IC Testing Cost," ITC International Test Conference, Apr. 2002, pp. 446-455, Paper 16.2.

Tabatabaei, Sassan, et al, "Embedded Timing Analysis: A SoC Infrastructure," IEEE Design & Test of Computers, May-Jun. 2002, pp. 24-36.

Tabatabaei, Sassan, et al, "An Embedded Core for Sub-Picosecond Timing Measurements," ITC International Test Conference, Apr. 2002, pp. 129-137, Paper 5.3.

Tabatabaei, Sassan, et al, "Jitter Generation and Measurement for Test of Multi-Gbps Serial IO," ITC International Test Conference, Feb. 2004, pp. 1313-1321, Paper 46.3.

"Boundary-Scan Tutorial," Corelis, http://www.corelis.com/products/Boundary-Scan_Tutorial.htm.

"IEEE Standard Test Access Port and Boundary-Scan Architecture," The Institute of Electrical and Electronics Engineering, Inc., 2001, pp. i-iv and 1-200.

"IEEE Standard for a Mixed-Signal Test Bus," Test Technology Technical Committee of IEEE Computer Society, IEEE std 1149.4, pp. i-vi and 1-78, Approved Jun. 26, 1999.

"Standard Testability Method for Embedded Core-Based Integrated Circuits," (Draft), Test Technology Technical Committee of IEEE Computer Society, Standard IEEE 1500/D11, pp. i-vii and 1-131, Jan. 2005.

Non-Final Office Action for U.S. Appl. No. 11/340,147 mailed Sep. 26, 2007, 7 pages.

Final Office Action for U.S. Appl. No. 11/340,147 mailed Jan. 23, 2009, 6 pages.

Non-Final Office Action for U.S. Appl. No. 11/520,200 mailed Apr. 2, 2009, 7 pages.

Non-Final Office Action for U.S. Appl. No. 11/520,344 mailed May 15, 2009, 11 pages.

Non-Final Office Action for U.S. Appl. No. 11/520,276 mailed Apr. 15, 2009, 8 pages.

Final Office Action for U.S. Appl. No. 11/520,282 mailed Apr. 16, 2009, 9 pages.

Non-Final Office Action for U.S. Appl. No. 11/520,530 mailed Apr. 30, 2009, 9 pages.

Non-Final Office Action for U.S. Appl. No. 11/520,344 mailed Nov. 20, 2008, 9 pages.

Non-Final Office Action for U.S. Appl. No. 11/520,480 mailed Oct. 31, 2008, 8 pages.

Non-Final Office Action for U.S. Appl. No. 11/520,282 mailed Oct. 30, 2008, 8 pages.

Non-Final Office Action for U.S. Appl. No. 11/520,530 mailed Nov. 24, 2008, 10 pages.

Non-Final Office Action for U.S. Appl. No. 11/340,147 mailed Apr. 30, 2008, 4 pages.

Non-Final Office Action for U.S. Appl. No. 11/520,423 mailed May 1, 2008, 10 pages.

* cited by examiner

US 7,598,726 B1

METHODS AND APPARATUSES FOR TEST METHODOLOGY OF INPUT-OUTPUT CIRCUITS

RELATED APPLICATIONS

This application claims priority to U.S. Provisional Patent Application No. 60/716,386, entitled VARIOUS METHODS AND APPARATUSES FOR INPUT-OUTPUT DESIGNS, filed on Sep. 12, 2005.

FIELD OF THE INVENTION

Aspects of embodiments of the invention generally relates to the field of self test and repair for Input-Output circuits (I/Os). More specifically, an embodiment of the invention provides Direct Current (DC) test features for I/Os to reduce the test cost.

BACKGROUND OF THE INVENTION

Any integrated circuit (IC) device typically includes a number of input/output (I/O) circuitry to communicate information with the outside world. Different types of I/Os may be used in a chip that support different signal voltage levels, current drives, data protocol, and data rates. I/Os, like all other circuits on the chip, are subject to random defects and statistical process variations, which may render them faulty. Consequently, the I/O circuits are tested on each device to ensure they meet their advertised specifications. The I/O test methodology employed strongly depends on the type of the I/O in general. However, almost all types of I/O are tested for DC parameters because such tests reveal a significant portion of faults very quickly.

The most widely used DC test methodologies are based on automatic test equipment (ATE). Each I/O is connected to an external tester pin, through which the I/O connects to a parametric measurement unit (PMU). The PMU is capable of forcing voltage and measuring current or forcing current and measuring voltage.

These capabilities enable PMU to perform a wide variety of tests, such as output voltage, drive current, leakage current, and input voltage threshold tests. The newer external testers use per-pin PMU architecture to test a large number of I/Os in parallel. Older testers contained a number of PMUs that were multiplexed to different pins. Such testers would use serial approach to test all the I/Os connected to the ATE pins. Although flexible and fast, the use of ATE for I/O test is becoming increasingly expensive because of large tester pin requirements.

Another method of testing is based on connecting a number of I/Os together on the device interface board (DIB) and connecting the resulting node to a PMU. This reduces the number of tester pin requirements, but may be subject to error due to I/O leakage currents. Shorting of the I/Os on the DIB also prevents performing embedded timing tests of several I/Os in parallel, which leads to a longer overall test time.

SUMMARY OF THE INVENTION

One embodiment of the invention may be as follows. A device interface board may exist between a platform containing Input-Output (I/O) circuits, such as a chip, Printed Circuit board, etc., and an external test unit. The device interface board may have a first plurality of connection paths to connect two or more I/O circuits in a first group of I/O circuits to a first pin on the tester that is external to a platform containing all of the I/O circuits. The first pin couples to a first Parametric Measurement Unit (PMU). The first plurality of connection paths connects the two or more I/O circuits in the first group of I/O circuits to the first PMU via their own resistor.

BRIEF DESCRIPTION OF THE DRAWINGS

The drawings refer to embodiments of the invention in which.

Figure 1:
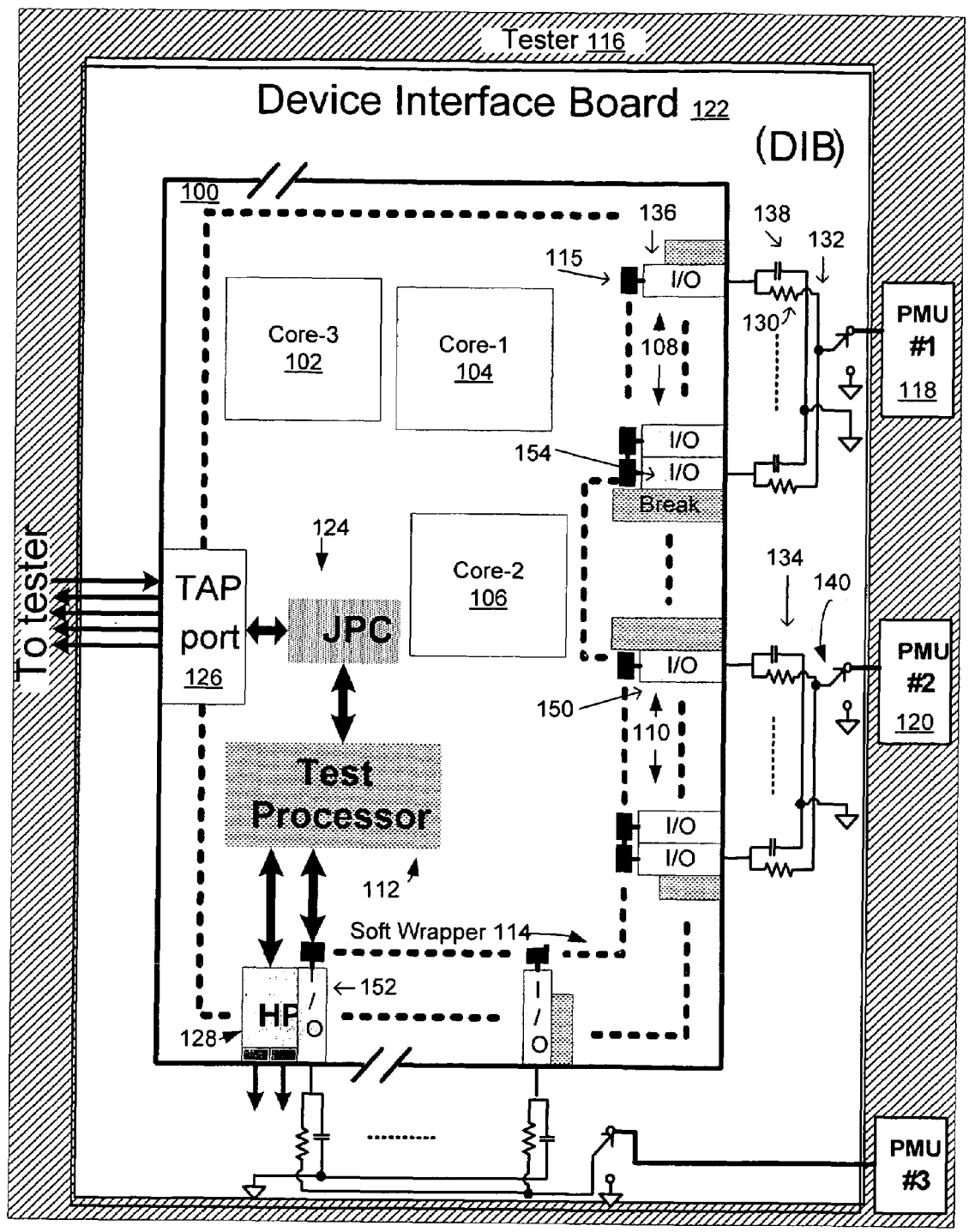
FIG. 1 illustrates a circuit diagram of an embodiment of a system that includes on-chip components, an external testing unit that provides Parametric Measurement Unit (PMU) capability, and a Device Interface Board.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific data signals, named components, connections, etc., in order to provide a thorough understanding of the embodiments of the invention. It will be apparent, however, to one of ordinary skill in the art that the embodiments of the invention may be practiced without these specific details. However, the specific numeric references should not be interpreted as a literal sequential order but rather interpreted as the first group of I/Os is different than a second group of I/Os. Thus, the specific details set forth are merely exemplary. The specific details may be varied from and still be contemplated to be within the spirit and scope of the claims.

In general, various methods and apparatuses are described for a system that includes some on-chip components, e.g., I/Os, test processors, soft wrappers, etc., an external testing unit that provides Parametric Measurement Unit (PMU) capability, a Device Interface Board (DIB) that includes resistors capacitors and perhaps other components between the chip and the external tester, and various tests performed on the I/Os by the on-chip testing logic and external testing unit facilitated through the DIB.

FIG. 1 illustrates a block circuit diagram of an embodiment of a system that includes on-chip components, an external testing unit that provides Parametric Measurement Unit (PMU) capability, and a Device Interface Board.

The on-chip 100 components may include a set of intellectual property cores 102-106 to provide functionality to the chip 100 and those cores such as a first group of I/Os 108 and a second group of I/Os 110, a test processor 112, and a soft wrapper chain 114.

The chip 100 has multiple groups of Input-Output circuits (I/Os), each group connectable to a single pin on a tester 116 that is external to the chip 100 containing all of the I/O circuits. The single pin couples to a first Parametric Measurement Unit (PMU) in the external tester 116. A first group of I/O circuits 108 connects to a first pin 118 on the tester 116 that provides PMU capability, a second group of I/O circuits 110 connects to a second pin 120 on the tester 116 that provides PMU capability, etc.

A soft wrapper chain logic circuit 114 couples to all of the groups of I/O circuits. The soft wrapper circuit 114 has logic configured to send control signals to enable as well as disable pull up and pull down transistors in the first group of I/O circuits 108 independent of enabling or disabling the pull up and pull down transistors in the second group of I/O circuits 110. The soft wrapper circuit 114 has additional logic configured to send control signals to perform a Direct Current (DC) output voltage parameter tests on the I/Os. The soft wrapper circuit 114 has additional logic configured to send control signals to perform input DC voltage parameter test simultaneously on each I/O circuit in each group of I/O circuits. The soft wrapper circuit 114 has additional logic configured to compensate a Direct Current (DC) voltage parameter test based on leakage current from a group of I/O circuits.

The soft wrapper chain 114 exchanges data between each I/O and the test soft processor 112. The soft wrapper chain 114 may also include an integrated wrapper for delay and timing tests. In an embodiment, the integrated wrapper for delay is separate from the soft wrapper 114. The soft wrapper chain 114 does both issue commands to the I/Os for testing purposes, and receives the data back from the I/Os for analysis. Thus, in this architecture, each I/O is connected to an associated soft wrapper, such as a first soft wrapper 115 (SW), and may also connect to an associated Integrated Wrapper for Delay test (IWD). In an embodiment, each I/O has an associated soft wrapper. The soft wrappers for the I/Os connect serially to form soft wrapper chain. The IWD uses delay circuits and a launch and capture measurement methodology to perform delay and timing test. The soft wrapper circuit 114 has additional logic configured to send control signals to perform a delay parameter test on each I/O circuit in the group of I/O circuits simultaneously with each other. Note, each I/O circuit in a group of I/Os connects to the single PMU pin through its own resistor on the DIB 122.

The soft wrapper 115 is a digital synthesizable circuit that provides digital stimuli and control signals to each I/O and the IWD. The soft wrapper 115 also captures I/O and IWD signals for later analysis. The soft wrapper chain 114 is connected in a serial architecture similar to the IEEE1149.1 boundary scan modules. The SW 114 exchanges data serially with the I/O test processor 112, which in turn communicates with off-chip equipment through (JPC) JTAG-to-IEEE1500 (JPC) communication converter 124 and the TAP controller 126.

In an embodiment, the soft wrapper circuit 115 is part of an I/O wrapper, and may be delivered as soft macro or synthesizable soft core. An I/O wrapper is the circuitry dedicated to each I/O for test and debug operations. The soft wrapper 115 uses a boundary scan mechanism for exchanging test data with their respective I/O using modularity and reduced routing congestion features. In one embodiment, the soft wrapper circuit 115 includes a circuit similar to the digital boundary scan module used in IEEE 1149.1 or IEEE 1149.4 standards. In an alternate embodiment, the soft wrapper circuit 115 is delivered as hard macro within the I/O frame. A chain of I/O soft wrapper circuits 114 may serve as boundary scan modules for self test and repair enabled I/Os. The soft wrapper 115 is a digital modified boundary module to optimize test time and area overhead and serial scan of test data to and from the I/Os.

The chip 100 also includes a hard processor 128, which is typically used for timing test. The hard processor 128 may be delivered as hard macro.

As discussed, the chip 100 includes a Test Processor 112, which communicates with the external tester 116 to receive data and instructions, generates data for the soft wrapper chain 114 and analyzes the test results. The main Test Processor 112 may be delivered as a soft macro.

The chip 100 includes a protocol converter 124, such as a JPC, which acts as a communication bridge between the TAP port 126 and the Test Processor 112.

As discussed, the I/Os on the chip 100 are divided in a number of groups, such that each group is connected to a single PMU through resistors. Every I/O circuit in the group of I/O circuits has logic configured to support an enable/disable feature for pull-up and pull-down transistors in that input-output circuit. The soft wrapper chain 114 by sending control signals into each I/O allows the driver enable/disable features, and pull-up and pull-down enable/disable features to implement selectively turning on and off each desired I/O during a test. The soft wrapper chain 114 may send control signals to place the I/Os in one of four receiving modes: High impedance—I/O disabled so no current draws in or out, except for small leakage; pull up transistor enabled so that appreciable current can be drawn from the I/O and the I/O's resistance may be about 10 Kohm; pull down transistor enabled so that appreciable current flows into the I/O, and bus hold, which cause the I/O input to be pulled up or pulled down depending on previous logic driven at the input of the I/O. In an embodiment, the pull up or pull down transistor cooperates with an associated resistor connected to VDD or VSS in a pull up/pull down circuit.

By enabling one I/O at a time, effectively a multiplexing scheme is established and I/Os output specific parameters can be tested sequentially, while input specs may be tested substantially in parallel. This method reduces the number of required PMUs significantly without requiring additional access mechanisms on the chip 100. This method accounts for potential inaccuracy induced by large cumulative leakage current when the number of I/Os in a group is large by the use of a calibration method. Also, this method allows performing embedded tests in parallel for multiple I/Os, such as I/O wrap or delay tests because the resistor at each I/O's output isolates the I/O from the grounded PMU. Also, the resistors on the Device Interface Board, such as a first resistor 130, allow measurement of all output voltage parameters through a voltage force and current measurement rather than current force and voltage measurement.

The off-chip components include the DIB 122 and the external tester 116.

The DIB 122 has a plurality of connection paths to connect two or more Input-Output (I/O) circuits in each group of I/O circuits to a first pin on a tester that is external to the platform, such as a chip 100, containing all of the I/O circuits. For example, the first pin 118 that couples to a PMU connects to the first group of I/Os 108 through a first connection path 132 that includes a plurality of resistors, capacitors and a switch. Another plurality of connection paths 134 in the DIB 122 connects a second group of I/O circuits 110 to a second pin 120 associated with a second PMU. Each connection path connects each I/O circuit to the PMU via its own series resistor.

The resistors in each connection path, such as a first resistor 130, are used to connect a corresponding I/O, such as a first I/O 136, to a single PMU pin 118. A group of these resistors connect to the same single PMU pin. The ends of all of the resistors in a group are shorted together rather than the outputs of the I/Os in that group being shorted together. These resistors provide the current load for the I/Os output voltage tests, enable background leakage current cancellation, and also enable other tests to run in parallel for multiple I/Os for analog delay test.

These resistors are useful in compensating for the cumulative leakage current, especially when a large number of I/Os converge to a single PMU. These resistors also act as an insulation device from grounded PMU to allow each I/Os Alternating Current output voltage to develop when performing embedded delay test on multiple I/Os in parallel so that the output voltage may develop on each I/O individually and then be fed back into the I/O circuit. The use of resistors and background current cancellation allow serial output DC voltage testing of each I/O's DC parameters with high accuracy even when the number I/Os tested with a single PMU is a large number.

The device interface board 122 further includes a plurality of capacitors. Each I/O circuit in the first plurality of I/O circuits is connected to its own resistor and its own capacitor on the device interface board. The capacitors in the connection paths, such as a first capacitor 138, connect to the resistor and input-output circuit on one side and on its other side connects to ground. The capacitors are used for timing and AC tests and have negligible impact on the DC tests.

The device interface board 122 further includes a switch in the plurality of connection paths for each group of I/Os to connect a terminal of all of the resistors coupled to their respective I/O circuits in each group of I/O circuits to ground (GND) for timing tests to avoid the impact of the PMU's impedance on such tests. The switches, such as a first switch 140, connect the other end of the resistors in the group to GND.

Thus, the DIB 122 uses external passive components, such as switches, resistors, and capacitors, to connect multiple I/O circuits to a single PMU. The DIB 122 does not require adding on-chip circuits to get access to the I/O PAD. Comparing to the on-chip bus based method, the DIB 122 does not use on-chip analog buses for accessing the I/O pads. The DIB 122 routes all the connections to mate multiple I/Os to a single PMU and does this for one or more groups of I/Os on the chip 100.

This methodology tests multiple I/Os with a single PMU without requiring any additional on-chip 100 circuit connected to the I/O PAD. The methodology is based on connecting a group of I/Os to a single PMU through resistors. Avoiding analog buses makes this solution much more portable from one I/O structure to the next. Also, the resistors eliminate the shortcomings of a previous I/O shorting method on a DIB. This methodology may also use special techniques to cancel the impact of leakage current on test results for improving measurement accuracy.

Note, this architecture works with a single PMU connection for all I/Os on a chip 100 as multiple groups each going to their own PMU pin. The forming of multiple I/O groups and connecting them each to a corresponding PMU is an enhancement to improve accuracy and test time. This architecture allows use of small number of tester pin contacts to test the DC parameters of a large number of I/Os without requiring an on-chip access mechanism. This greatly improves scalability of the test methodology because it does not require additional customized analog wrappers.

The external tester includes multiple pins that couple to PMUs to provide voltage and current force and measurement capabilities such as a first pin 118 and a second pin 120.

As discussed, for DC tests, the I/Os may be divided into a number of groups. Each I/O within a group is connected to its corresponding resistor and capacitor on the device interface board. The other end of all the resistors for that group are connected to a single parametric measurement unit (PMU) in the external tester, such as to the first pin 118. In an embodiment, each group includes 50 to 100 I/Os, therefore, 10 to 20 PMUs are sufficient to test a chip with 1000 digital I/Os. This drastically reduces tester channel requirements. The capacitors are used for timing tests and have negligible effect on the DC test results.

The resistor value for each I/O is chosen to provide the nominal current load during an input or output voltage test. In some cases, two resistor values may result from the voltage output low logic value (VOL) and voltage output high logic value (VOH) requirements. In such cases, the larger value may be used. For example, assume an I/O nominal output current is 10 mA, the supply voltage is 2.5V, the nominal VOH is 2.1V, and nominal VOL=0.3V. In this example, the resistor value from VOH and VOL are 2.1V/10 mA=210 ohms and (2.5−0.3)V/10 mA=220 ohms. The larger value of 220 ohms will be chosen in this case.

This methodology tests VOH/VOL (output DC voltage low and High), VIH/VIL (input DC voltage low and High), pull-up/pull-down current, and leakage current for all I/Os. This methodology may also include a calibration technique to improve measurement accuracy in the presence of potentially large leakage current associated with the group I/Os connected to the single PMU. The leakage current is subtracted out in the Output voltage test. The test patterns are provided through 1149.1 compliant digital wrappers.

Figure 2:
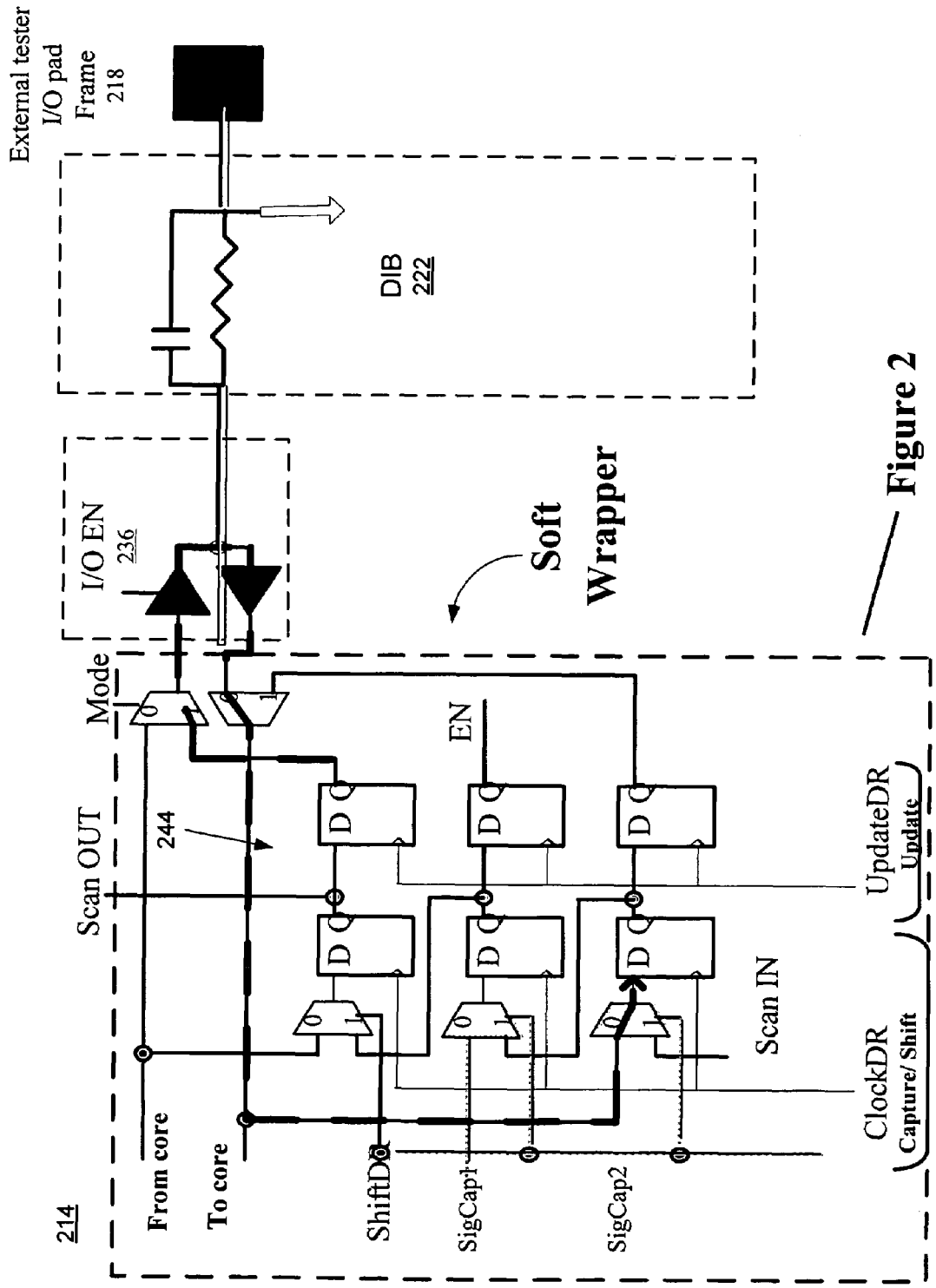
FIG. 2 illustrates an embodiment of a portion of a soft wrapper logic circuit.

FIG. 2 illustrates an embodiment of a portion of a soft wrapper logic circuit. The portion of a soft wrapper logic circuit 214 reduces the test time and on-chip test circuit overhead by locally storing in the soft wrapper logic circuit 214 the results of each individual I/O test if tested sequentially, and shifting in merely enough bits to test the next I/O in line for testing rather than a full shift. For example, one or more of the flip-flops 244 may provide temporary storage for the results of tests run on the I/O 236 corresponding to that portion of the soft wrapper logic circuit 214. When at the final I/O of that group of I/Os completes its testing, then the soft wrapper logic circuit 214 serially shifts out all of the locally stored test results in the flip flops 244 and compares those locally stored test results to expected results.

Figure 3:
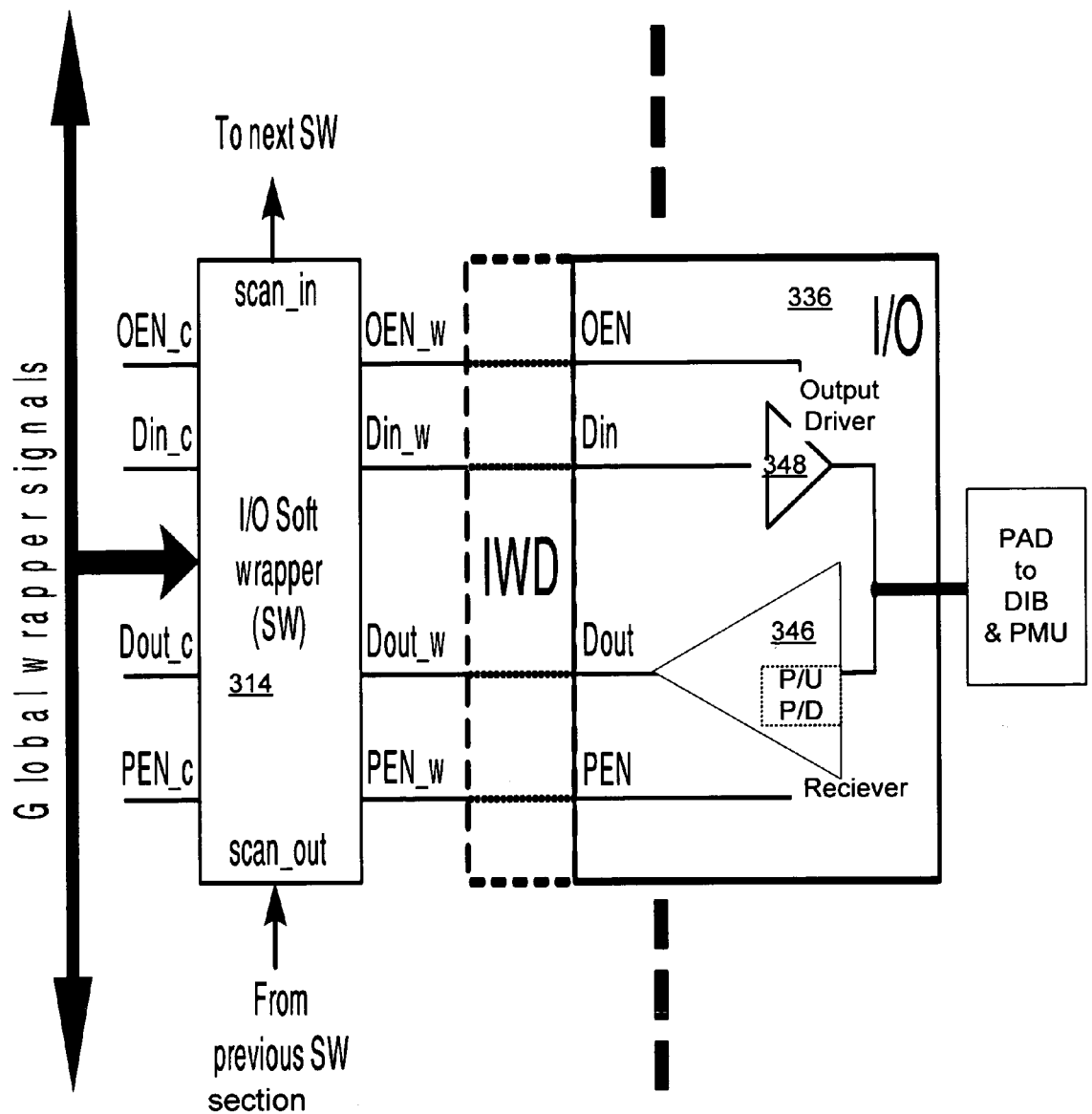
FIG. 3 illustrates an embodiment of an I/O in the group of I/Os undergoing an output DC voltage test.

FIG. 3 illustrates an embodiment of an I/O in the group of I/Os undergoing an output DC voltage test. The connections between an embodiment of the soft wrapper logic circuit 314 and the I/O 336 are illustrated with more detail.

As discussed above, the soft wrapper logic circuit 314 has logic to send control signals to enable both pull up and pull down transistors in the receiver 346 of the I/O circuit 336, enable the output driver amplifier 348 in each I/O circuit, to disable both the pull up and the pull down transistors in the receiver 346 of the I/O circuit 336, to disable the output driver amplifier 348 in each I/O circuit, and to send and receive logic values to/from the corresponding I/O 336.

The soft wrapper logic circuit 314 may cooperate with the external tester to perform a DC output voltage test and debug on each I/O. As discussed previously, the soft wrapper logic circuit 314 performs a Direct Current (DC) voltage parameter test and/or a DC current parameter test on each I/O circuit in a group of I/O circuits connected through its own resistor to a first pin on an external test unit that executes a Parametric Measurement Unit (PMU) function.

Each I/O, such as the first I/O 336, has its output High and Low voltage (VOH and VOL) measured. Overall, VOH/VOL tests include comparing each I/O's output voltage to a pre-determined value for logic High or Low when a nominal current is supplied or sunk to/from the I/O.

An example, sequence of steps to perform a DC output voltage level test may be as follows.

A DC output voltage level, corresponding to a logic high or logic low, supplied from each I/O circuit in the group of I/O circuits, is determined by one I/O circuit at a time doing the following operations. The first I/O 336 will be used as an example I/O under test.

Initially, disable the output driver of every I/O in the group of I/Os connected to that PMU, such as a first output driver 348. Next, disable every I/Os pull up and pull down transistors circuits in the receiver of each I/O in the group, such as a first receiver 346. Essentially, the I/Os in this group are disabled by commands from the soft wrapper logic circuit 314. This puts all of the I/O PAD outputs in High impedance mode, where the output currents are very small.

Enabling an output driver 348 and a pull up transistor of the individual I/O circuit under test, which causes the I/O circuit 336 to output its high DC voltage to develop at the I/O PAD. Next, measure a first amount of current flowing to the PMU from that individual I/O circuit 336 under test. Note, the measured amount of current is the sum of the leakage currents for all of the disabled I/O circuits plus the amount of current from the individual I/O circuit 336 under test. Lastly, sequentially repeat the determining of DC output voltage level steps above for each remaining I/O circuit in the group.

In other words, the soft wrapper logic circuit 314 sends control signals to apply logic High to the input of the I/O under test (IUT) 336. This logic will transfer to the I/O pad when the driver's 348 output is enabled. The soft wrapper logic circuit 314 enables the pull-up/pull-down in the receiver 346, if applicable, for the I/O under test 336. The soft wrapper logic circuit 314 enables the output of the I/O under test 336 to transfer the input logic to the I/O PAD output. This causes a voltage corresponding to the Logic High to develop at the I/O PAD.

However, these steps can be augmented and improved to calibrate the measured DC parameters test to account for the leakage current.

The total leakage current from the group of I/O circuits may be determined by forcing the pin that supports the PMU to ground DC voltage potential (0 VDC) and measuring the amount of current flowing from the group of disabled I/O circuits to the PMU. The total leakage current from that group of I/Os in measured by the PMU connected to it.

This current represents background current, which is the sum of all group I/O leakages.

$$I_{OH} = \sum_{i=1}^{M} I_{leak\_i} \quad \text{Equation 1}$$

where $I_{OH}$ is the sum of leakage currents for VOH test (when PMU voltage is 0), $I_{leak\_i}$ is the high-impedance leakage current for the i-th I/O in the group, and M is the number of I/Os in the group.

The determined output DC voltage level supplied from each I/O circuit under test is adjusted for the leakage current by the following step. Subtract the measured amount of total leakage current from the measured amount of current from the individual I/O circuit under test 336 and convert the remainder of the current to a DC output voltage by multiplying the difference current by the resistor's DC load resistance to determine the calibrated output DC voltage level supplied from that I/O circuit under test 336. Thus, subtract the background current from the measured current and multiply with the resistor connected to the enabled I/O under test 336. This provides an accurate estimate of VOH with a nominal load provided by the resistor. The impact of potentially large background current is significantly reduced with this technique.

In an embodiment, assuming the I/O under test is the k-th I/O in the group, the PMU current is obtained as below.

$$I_{PMU0\_k} = I_{H\_k} + \sum_{i=1, i \neq k}^{M} I_{leak\_i} \quad \text{Equation 2}$$

where $I_{PMU0\_k}$ is the PMU current when the k-th I/O output is enabled and PMU voltage is 0V, and $I_{H\_k}$ is the current supplied by the k-th I/O. Next, Compute the VOH for the k-th I/O as below:

$$VOH = R_k \cdot (I_{PMU0\_k} - I_{OH}) = R_k \cdot (I_{H\_k} - I_{leak\_k}) \approx R_k \cdot I_{H\_k}$$

where $R_k$ is the resistor connected to the k-th I/O. The above approximation is valid because the $I_{leak\_k}$ is much smaller than $I_{H\_k}$; the $I_{H\_k}$ is typically in the mA range while the $I_{leak\_k}$ is in the uA range.

Next for the group, sequentially test each remaining I/O circuit in the group by disabling the pull up transistor and the output driver 348 associated with the I/O circuit 336 previously tested and enabling the pull up transistor and output driver of the next I/O circuit to be tested. Repeat this pattern until the last I/O circuit in that group of I/O circuits completes its VOH test, then VOL test. (i.e. Measure the PMU current for that I/O under test and subtract the background current to determine actual output DC voltage for that I/O.) Lastly, compare each I/O circuit's output voltage to a pre-determined value for logic High or Low to see if that I/O passes or fails the DC parameter test.

The test is performed in a similar fashion for other groups of I/O on the chip either in parallel or sequentially depending on the number of PMUs available. Thus, for the testers with PMU-per-pin architecture, all groups can be tested in parallel. For tester with multiplexed PMUs, the number of groups that can be tested in parallel is the same as the number of PMUs in the tester. The latter case is usually true for older testers.

Referring to FIG. 1, a first DC output voltage parameter test on a first I/O 136 in a first group of I/O circuits 108 may be performed while in parallel a second output Direct Current output voltage parameter test is performed on a second I/O 150 in a second group of I/O circuits 110, and a third I/O 152 in a third group, etc.

Note, the PMU merely needs to be forced low one time and remains low during the testing of all of the individual VOH testing of each I/O in the group. This saves time rather than forcing the PMU low every time an I/O in the group is tested. I/Os making up a group of I/Os that are routed to a single PMU can be physically all adjacent neighbors or on a physically distinct part of the chip 100 but share a common DC operating voltage.

The output voltage for logic low (VOL) test for each I/O can be performed in a similar manner. VOL is tested similar to VOH except that the I/O logic is set to Low and the PMU voltage is forced to the I/O supply voltage (i.e. drive the PMU to VDD high voltage) during the test. Also, the output driver and the Pull Down transistor of one I/O at a time are enabled.

Figure 4A:
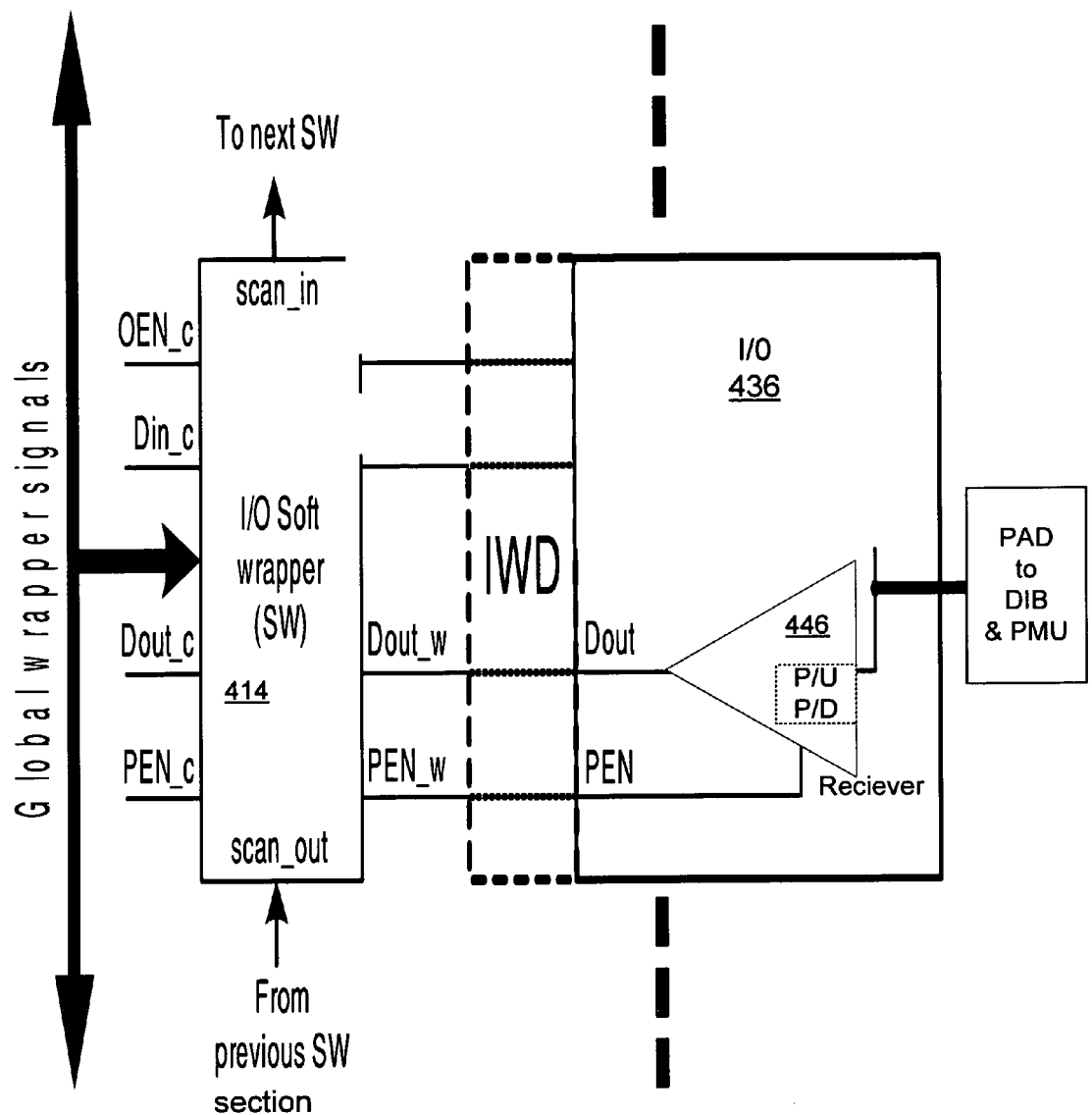
FIG. 4a illustrates an embodiment of a first I/O in a group of I/Os undergoing an input DC voltage test at the same time with the other I/Os in that group.

FIG. 4a illustrates an embodiment of a first I/O in a group of I/Os undergoing an input DC voltage test at the same time with the other I/Os in that group. The first I/O 436 will be used as an example I/O under test.

As discussed above, the soft wrapper logic circuit 414 has logic to send control signals to enable both pull up and pull down transistors in the receiver of each I/O circuit, enable the output driver amplifier in each I/O circuit, to disable both the pull up and the pull down transistors in the receiver of each I/O circuit, to disable the output driver amplifier in each I/O circuit, and to send and receive logic values to/from the corresponding I/O.

The soft wrapper 414 may cooperate with the external tester to perform a DC input voltage test and debug on each I/O. The soft wrapper 414 performs a Direct Current (DC) input voltage parameter test and/or a DC current parameter test on each I/O circuit in a group of I/O circuits connected through its own resistor to a first pin on an external test unit that executes a Parametric Measurement Unit (PMU) function.

Each I/O has its input High and Low voltage (VIH and VIL) measured.

An example, sequence of steps to perform a DC input voltage high voltage thresholds simultaneously on the group of I/O circuits connected to the same pin on the external test unit that supports the PMU function may be as follows.

Forming all of the I/O circuits in the group into one or more sub groups. Each group contains I/O circuits that have a same type and have a substantially similar input DC voltage threshold value.

The soft wrapper 414 disables the output driver of every I/O circuit in the group of I/O circuits connected to the same PMU pin. The pin that supports the PMU is forced to a first logic high input DC voltage threshold potential for all the I/O circuits in the group such as the first I/O 436. The pull down or pull up transistors in the receiver 446 is enabled for every I/O in that sub group of I/O circuits in the group that are of a same type and have a substantially similar input DC voltage threshold value. The test results for all of the I/O circuits in the group that are of a same type and have a substantially similar input DC voltage threshold value are stored locally in the soft wrapper 414. The test results are shifted with the soft wrapper 414. The test results are transferred to the soft test processor. The captured logic test results of each I/O from the I/O receiver output for all of the I/O circuits in the group that are of a same type and have a substantially similar input DC voltage threshold value are compared to expected results. For the high threshold input DC voltage test, the minimum voltage corresponding to a logic High should be applied to the I/O PAD and the I/O receiver output be examined to ensure it reflects the High logic.

The above steps are repeated for other types of I/O circuits in the group that have a different input DC voltage threshold by forcing the pin that supports the PMU to a second high threshold input DC voltage potential rather than the first high threshold input DC voltage potential. The test for other groups of I/Os on the chip connected to a separate PMU pin may be run in parallel or sequentially depending on the number of available PMUs.

The input voltage test may be further improved by calibrating for the DIB resistor voltage drop. Calibration of the applied input voltage occurs by estimating the DIB resistor voltage drop and decreasing the applied high voltage input threshold voltage by this amount of current times the DIB resistor value. Nominally, in this example, the PMU pin is at 2 V, the I/O power supply is 2.5 V, the I/O is pulled up by a 10 kohm on-chip resistor located between the I/O power supply and the I/O pad, and the DIB resistor value is 1 Kohms. If the measured voltage drop across the DIB resistor is 0.1 VDC then the external tester should reduce the calibrated threshold input voltage to 1.9 VDC, apply the calibrated input voltage, and then capture logic results for all the I/Os in the group for analysis. 0.1 V compensation voltage in this example assumes that the I/O input voltage does not vary significantly when the I/O input voltage is changed by a small amount. Other methods may also be used to calculate the compensation voltage, e.g., by assuming that the I/O input current vary linearly with I/O input voltage or the voltage drop on the external resistor.

Thus, a calibrated high threshold input DC voltage potential for all of the I/O circuits in the first subgroup may be generated by decreasing the high threshold input DC voltage potential by a first voltage drop amount across the resistor between the I/O circuit in the first subgroup and the first pin, or an amount that is a function of this voltage drop, for example linearly proportional to the voltage drop. Next, the first pin that supports the PMU is forced to the calibrated high threshold input DC voltage potential for all of the I/O circuits in the first subgroup. Next, the test results from the applied calibrated input DC voltage potential for all of the I/O circuits in the first subgroup including the first I/O 436 are stored in their associated soft wrappers.

Note, the input voltage calibration process also yields pull-up and pull-down currents by the actual amount of current sensed by the PMU when calculating the voltage drop across the resistor on the DIB, which are important test parameters by themselves.

Repeat the above steps for other types of I/O circuits in the group that have a different input DC voltage threshold. Comparing all of the stored test results to expected results to see if each I/O circuit in the group(s) passes or fails its input DC voltage parameter test. Referring to FIG. 1, for example, a first I/O 136 may have 2.0 VDC input voltage high threshold and a fourth I/O 154 may have a 1.8 VDC input voltage high threshold.

The input voltage threshold for logic low (VIL) test is tested similar to VIH except that the PMU voltage is set to correspond to VIL for each type of I/O. The input voltage threshold for logic low applies the maximum voltage corresponding to a logic low to the I/O PAD and the I/O receiver output is examined to ensure it reflects the low logic.

Note, the PMU voltage force operation is typically a slow process that may take up to a few milliseconds. To ensure practical test time, the number of voltage force operations should be minimized. Generally, merely one force operation per sub group of I/O is required.

In an embodiment, two approaches can be used to test Voltage Input High threshold test. In the first approach as described above, all pull-up and pull-downs are disabled to reduce the leakage current significantly. Typical leakages will result in negligible drop on the load resistors; therefore, the PMU voltage appears at the I/O PAD. The next step is to divide the I/Os into a number of subgroups with similar VIH thresholds. This way, one PMU voltage force is sufficient to test all the I/Os in each subgroup. Upon application of the VIH voltage, the Soft wrapper 114 samples the logic values. These values are later compared inside or outside the chip 100 to the expected values. Typically, the same type I/Os have similar VIH and VIL settings and can form a sub-group for VIH/VIL test.

The second approach assumes that pull-up and pull-down will have to be active during the test. In this approach, the I/Os are divided in subgroups, such that each subgroup has similar VIH setting and current leakage (including any pull-up or pull-down currents). Typically, this may result in one or more sub-groups, for example:

1. 2.5V LVCMOS I/Os with high impedance inputs
2. 2.5V LVCMOS I/Os with pull-up inputs
3. 2.5V LVCMOS I/Os with pull-down inputs Similar sub-groups may exist for other types of I/Os, e.g., 1.8V ones, HSTL, SSTL, etc. An efficient test process includes programming the PMU voltage to the appropriate value that results in applying the correct VIH threshold to the I/Os in a sub-group. Upon application of the VIH voltage, the soft wrapper 414 samples the logic values. The test will continue for other subgroups by setting the PMUs to the new VIH voltage.

For sub-groups with high impedance inputs, the voltage drops on the resistors are negligible. Therefore, it is sufficient to set the PMU voltage to the desired VIH value.

For sub-groups with high pull-up inputs, the voltage drops on the resistors may not be negligible. Therefore, the resistor voltage drop should be accounted for as below:

$$V_{PMU\_k} = VIH_k - R_k \cdot IPU_{VIH\_k} \quad \text{Equation 3}$$

where $V_{PMU\_k}$ is the PMU voltage to be used for the test, $VIH_k$ is the nominal VIH test threshold, and $IPU_{VIH\_k}$ is the pull-up current when setting the PMU voltage to VIH for the k-th I/O. The $IPU_{VIH\_k}$ can be measured following the same procedure for measuring the I/O current during the VOH test except that the PMU voltage is set to $VIH_k$ instead of 0V.

Similar to the pull-up case, the PMU voltage is computed as below:

$$V_{PMU\_k} = VIH_k + R_k \cdot IPD_{VIH\_k} \quad \text{Equation 4}$$

where $IPD_{VIH\_k}$ is the pull-down current when setting the PMU voltage to $V_{PMU\_k}$ for the k-th I/O. The $IPU_{VIH\_k}$ can be measured following the same procedure for measuring the I/O current during the VOH test except that the PMU voltage is set to $VIH_k$ instead of VDDIO.

For one type of I/O with the same nominal output drive currents, the resistor connected to the I/Os have the same values and their $IPU_{VIH}$ are expected to be very close. In that case, a single PMU voltage force can be used to test a sub-group of I/Os with similar type and output drive.

The first approach may be preferable because it is faster, and for most cases provides the same test quality in terms of fault coverage as the second approach. The second approach may be necessary if there is significant interdependence between the pull-up and/or pull-down circuit and the I/O receiver circuitry.

VIL test can be performed similar to the VIH test. The main difference is that the VIL voltage threshold should be applied to the I/O PAD inputs.

Pull-up and pull-down current measurement tests may also be performed by the soft wrapper and external tester to test the relevant I/O circuitries by the following steps.

For the pull-up current test, the pull-up current is tested in a similar way as VOH, except that after background current measurement, only the pull-up transistor is enabled for the I/O under test before performing the second PMU current measurement. The difference between the two measurements provides an accurate estimate of pull-up current for each I/O.

For the pull-up current test, this test only applies to the I/Os with pull-up input. The following steps describe the pull-up current measurement method for such I/Os:

1. Disable the output driver and the receiver pull-up/pull-down circuit for all the I/Os in the group. Force PMU to 0V and measure the sum of leakage currents when all I/Os are in High impedance mode, as described in steps 1 and 2 in VOH measurement. This step may be skipped if is already measured during a previous VOH test.
2. Enable the receiver pull-up for the I/O under test (IUT).
3. Measure the PMU current while PMU is forcing 0V. The current is the sum of the leakage currents for disabled I/Os plus the current from IUT: Assuming the IUT is the k-th I/O in the group, the PMU current is obtained as below:

$$I_{PMU\ 0\_k} = IPU_k + \sum_{i=1, i \neq k}^{M} I_{leak\_i} \quad \text{Equation 5}$$

where $I_{PMU0\_k}$ is the PMU current when the k-th I/O pull-up is enabled and PMU voltage is 0V, and $IPU_k$ is the pull-up current for the k-th I/O.

1. Compute the IPU for the k-th I/O as below:

$$I_{PMU0\_k} - I_{0H} = IPU_k - I_{leak\_k} \approx IPU_k \quad \text{Equation 6}$$

The above approximation is valid because the $I_{leak\_k}$ is much smaller than $IPU_k$; the $IPU_k$ is typically in the hundreds of uA range while the $I_{leak\_k}$ is in a few uA range, resulting in an error in the 1% range.

2. Disable the pull-up for the previously tested I/O. Repeat the steps 2 to 4 for the next I/O to be tested. Continue until all I/Os with pull-up inputs in the group are tested.

If both VOH and IPU tests are being performed, the test times can be reduced by performing two PMU current measurements instead of one. The first measurement is as described in that step, and the second measurement would be performed after disabling the I/O output, which yields the results in equation 6. Subsequently, equation 6 provides an estimate of pull-up current.

The pull-down current is tested in a similar fashion as pull-up current, except that PMU voltage is forced to the I/O supply voltage.

The amount of leakage current can also be determined for quantitative pass/fail testing. The background current yields a collective measure of leakages of all the I/Os in one group. For individual Input voltage tests, the user can compare each DIB resistors voltage drop with the other resistors voltage drops in the group of I/Os and group I/Os with similar voltage dropping resistors when doing mass simultaneous input voltage testing.

The leakage test can be an important test to ensure I/O can interoperate with other chips on the board without adding unacceptable load to other drivers. Leakage test also verifies the integrity of ESD protection circuit.

The resistor on the DIB allows delay tests on all the I/O in a group of I/O at the same time. The resistor puts a buffer between the PMU pin, which is typically forced to VSS 0 VDC on one side during the timing test and the output of the I/O. The resistor allows a signal to develop on the output of the I/O.

Overall, the DC parametric test methodology and delay tests described above allow testing a large number of I/Os with only a small number of PMUs and hence small number of tester channel contacts. This method decreases the test cost by enabling testing multiple devices on the same tester simultaneously and/or using a cheaper tester with less number of pins. The mere additional requirement is that the I/Os undergoing the above tests should support an enable/disable feature for pull-up and pull-down transistors, when applicable.

The methodology described above provides accurate measurements of most important DC parameters including VOH/VOL, VIH/VIL, and pull-up/pull-down currents. This method also measures the leakage of a number of I/Os simultaneously. Such measurement provides an indication of gross leakage faults, but may not be able to detect marginal leakage faults due to the potential faults masking effect of measuring sum of leakages rather than each one individually. One way to reduce fault-masking likelihood is to reduce the number of I/Os in each group connected to a single PMU through resistors.

The methodology described above for DC test that supports Reduced Pin Count testing without requiring on-chip analog buses connected to I/O pads greatly improves scalability of I/O test solutions and reduces electrostatic discharge compliance concerns. This solves one of the major problems in providing a complete RPC without significant interference with the I/O designs. Such feature enables use of this solution on I/Os much more easily by testing the DC parameters of I/Os in a chip with minimal tester contact.

Figure 4B:
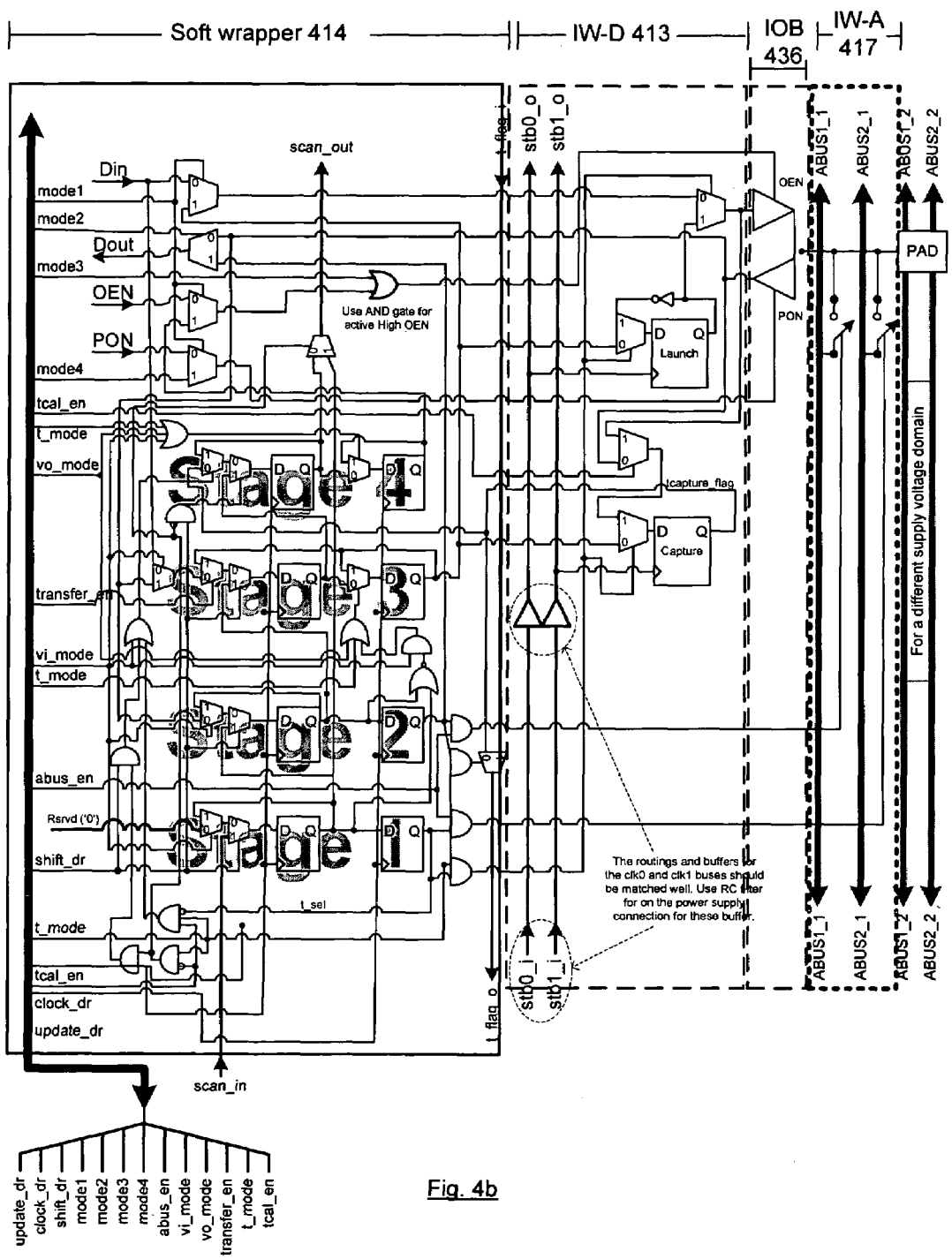
FIG. 4b illustrates a component level schematic diagram of an embodiment of an embedded logic enabled bidirectional I/O with wrappers for signal control and analog and delay test.

FIG. 4b illustrates a component level schematic diagram of an embodiment of an embedded logic enabled bidirectional I/O with wrappers for signal control and analog and delay test. The soft wrapper 414, integrated wrapper for delay 413, and the analog wrapper 417 are the circuitry dedicated to each I/O for test and debug operations of SIS. The wrappers are designed specifically for each I/O type and support different measurements. The bi-directional wrappers in 400 include three major sub-modules: soft wrapper circuit 414, an IW-D circuit 413, and an IW-A circuit 417. As shown in FIG. 4b, the wrappers in 400 include both the IW-D and the IW-A with the IO Buffer module 436 with an output driver amplifier and an input receiver amplifier. The IW-D and IW-A wrappers are separate, but co-exist and may be supported by the soft wrapper 414 simultaneously.

At the soft wrapper 414, control data comes via a pin and goes through multiple scan stages that capture the control and test signals. The soft wrapper 414 can supply signals to either the IW-A circuit 417, or the IW-D circuit 413, or to both the IW-A circuit 417 and IW-D circuit 413. Accordingly, the IW-A or IW-D may be eliminated in a design that does not need analog or delay test features, respectively. This may reduce area overhead.

As discussed, the I/O buffer 436 has both the output driver circuit coupled to an input-output port and the input receiver circuit coupled to the input-output port. The instruction processor controls the wrapper circuits 413, 414, and 417. The soft wrapper 414 has two or more scan registers, where the data value stored in each scan register can be shifted out for analysis. The soft wrapper 414 has two or more update registers to transfer stored data values between itself and an associated scan register. The soft wrapper 414 has a set of combinatorial logic coupled to the scan registers, the update registers and the instruction test processor. The soft wrapper has these registers coupled with the combinational logic to enable hold, scan, capture, and transfer states in order to re-use these registers as a temporary memory element when possible. The combinational logic and registers in the stages in the boundary module in I/O soft wrappers are re-used in the various timing and functional tests to allocate memory in the soft wrappers and the SIS processor for different tasks. This leads to reduced test time and tester vector memory.

Each scan register in each stage may be formed by the flip flops. During shift operations, the content of each scan register can be shifted out to the Test Processor or external tester for analysis, while simultaneously shifting in new content. Each scan register may use its associated combinational logic to have capture capabilities, or hold capabilities, as required by different embedded instructions.

Each update register in each stage may be formed by the flip flops. Each update register may use its associated combinational logic to have update capabilities to transfer stored logic values between itself and an associated scan register in that stage, or hold stored logic values independent of an input applied to the update register.

The soft wrapper 414 includes these flip flop registers and some MUXes for temporary test data storage. Accordingly, test data at each stage does not need to be shifted out of the soft wrapper immediately. Rather, test data at each stage may be stored in the temporary data storage in the soft wrapper itself can be sequentially accessed at a later time. In one embodiment, the soft wrapper 414 supports hold operations on its example number of four scan registers and four update registers. Selective activation of hold state of the registers in different modes of operation provides ability to implement multiple "partial update", "partial capture", and "partial shift" operations. These additional operations can be used by different SIS instructions to reduce test time.

The soft wrapper 414 includes a digital boundary scan module (DBM), with multiple shift/update stages such as an example number of four stages. The DBM exchanges data with the test processor for functional tests, delay tests, DC parametric measurements, and IEEE11494.1 standard compliance. The DBM provides boundary scan mechanism for exchanging test data with each I/O because of its modularity and reduced routing congestion features. The soft wrapper 414 is designed to comply with IEEE 1149.1 standard for enabling users to perform board level tests. The soft wrapper 414 supports all mandatory and optional instructions of IEEE1149.1 standard.

For functional tests, the DBM applies 0 or 1 to the I/O and captures the I/O input receiver logic to check whether I/O can transfer the logic correctly. For delay tests, the DBM transfers initialization data to and captures the timing test flag from the timing test circuit in the IW-D. Examining the tcapture_flag indicates whether the I/O delay is more or less that a programmed delay specified by the strobe generator circuit. For DC parametric measurements, which involve the use of analog buses in IW-A for low frequency voltage and current test, the DBM controls the output buffer data, enable control input, and the analog switches in the IW-A to perform different measurements. The IO receiver output is also captured by the DBM. For IEEE11494.1 standard compliance, three scan/update stages support all ten mandatory and optional public instructions of IEEE1149.1 standard for bi-directional IO. These instructions are: BYPASS, SAMPLE, PRELOAD, EXTEST, INTEST, RUNBIST, CLAMP, IDCODE, USERCODE, and HIGHZ.

Figure 5:
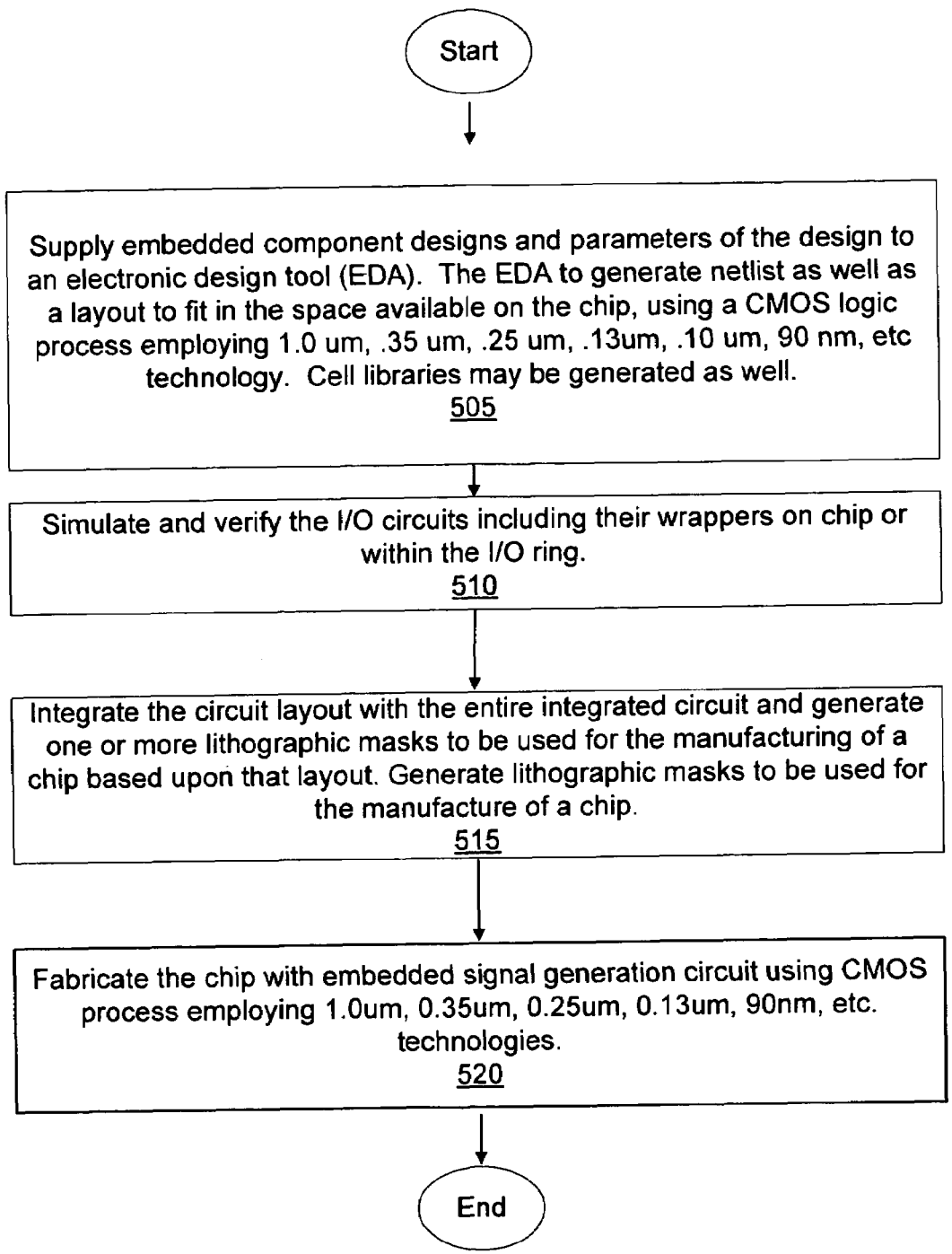
FIG. 5 illustrates an example of a process for generating a device with a test circuit from designs of timing components utilizing an electronic circuit design generator such as may form part of an Electronic Design Automation (EDA) toolset.

FIG. 5 illustrates a flow diagram of an embodiment of an example of a process for generating a device with a test circuit from designs of the wrapper components. The example process for generating a device with a test circuit from designs of the wrapper components may utilize an electronic circuit design generator, such as a memory compiler, to form part of an Electronic Design Automation (EDA) toolset. The information representing the apparatuses and/or methods for the test circuitry, I/Os etc may be contained in an Instance such as a cell library, soft instructions in an electronic circuit design generator such as a complier, or similar machine-readable storage medium storing this information. The information representing the apparatuses and/or methods stored on the machine-readable storage medium may be used in the process of creating the apparatuses and/or methods described herein.

Aspects of the above design may be part of a software library containing a set of I/O cells. The I/O Libraries provide a very broad set of basic I/O functions and are designed to accommodate more advanced I/O capabilities. The library cells are developed in accordance with industry standards and support a wide range of I/O frequencies. I/O Library is the basis for interfacing to memory, networking, storage, graphics and mixed signal applications. The I/O cells can be designed for either wire or flip-chip I/O bonding strategies, and the libraries contain all of the cells necessary to create a complete pad ring with a strong power rail structure, robust ESD, and latch-up resistance. The I/O Libraries may be ideally suited for 0.13 µm, 90 nm, and even smaller designs where ESD is an increasingly difficult problem. I/O Library cells are well-suited to many different IC designs because they: can be adapted to accommodate multi-gigabit frequencies; generate more robust and reliable I/O rings; support both bond wire and flip-chip implementations (Flip-chip assembly allows more connections to be present on a smaller die); are capable of supplying high current due to power and ground cell design attributes; support different voltage thresholds; and support different current drive strengths thresholds.

The electronic circuit design generator may be used for making a highly configurable, scalable System On a Chip (SOC) input output system that integrally manages input and output data, control, debug and test flows, as well as other applications. In an embodiment, an example electronic circuit design generator may comprise the following: a graphic user interface; a common set of processing elements; and a library of files containing design elements such as circuits, control logic, and cell arrays that define the electronic circuit design generator. The electronic circuit design generator may be used in designing a System on a Chip (SOC). Traditionally, there exist two major stages of SOC design: front-end processing and back-end programming. Front-end processing comprises the design and architecture stages, which includes design of the SOC schematic. The front-end processing may include connecting models, configuration of the design, simulating and tuning during the architectural exploration. The design is typically simulated and tested. Front-end processing traditionally includes simulation of the circuits within the SOC and verification that they should work correctly. The integration of the electronic circuit design may include packing the cores, verifying the cores, simulation and debugging. The tested and verified components then may be stored as part of a library.

Back-end programming traditionally includes programming of the physical layout of the SOC such as placing and routing, or floor planning, of the circuit elements on the chip layout, as well as the routing of all interconnects between components. Thus, the floor plan may be generated imported and edited. After this, the design may be outputted into a Netlist of one or more hardware design languages (HDL) such as Verilog, VHDL (Very-High-Speed Integrated Circuit Hardware Description Language) or SPICE (Simulation Program for Integrated Circuit Emphasis). A Netlist describes the connectivity of an electronic design such as the components included in the design, the attributes of each component and the interconnectivity amongst the components. After the Netlist is generated, synthesizing of the design with Register Transfer Level (RTL) may occur. Accordingly, back-end programming further includes the physical verification of the layout to verify that it is physically manufacturable and the resulting SOC will not have any function-preventing physical defects. The front-end views support documentation, simulation, debugging, and testing. The back-end files, such as a layout, physical Library Exchange Format (LEF), etc are for layout and fabrication.

In block 505, the designs for the soft wrapper and other circuits to test the I/Os are supplied to the electronic circuit design generator, as well as other device design parameters such as number of delay elements and MUX sizes. Thus, the designs for cell representations making up the I/O circuits and soft wrappers, etc. stored in a cell library may be supplied to the electronic circuit design generator. As discussed, the electronic circuit design generator may be a software program comprised of multiple algorithms and designs for the purpose of generating a circuit design and a layout in a space available on a target chip. The set of application-specific algorithms and interfaces of the electronic circuit design generator may be used by system integrated circuit (IC) integrators to rapidly create a signal generation circuit suitable for the specific application. In an embodiment this may involve supplying the circuit netlist and layout fitting in a space on the chip, for example in the space equivalent to two I/Os.

An example electronic circuit design generator may comprise the following: a graphic user interface, a common set of processing elements, and a library of files containing design elements such as circuits, and control logic. The library of files containing design elements may be a stand alone program by itself as well. In addition, the electronic circuit design generator may include object code in a set of executable software programs. The electronic circuit generator provides timing diagrams, power and area aspects of each component, models coded to represent the components in order to run actual operation and configuration simulations. The electronic circuit design generator may generate a netlist and a layout targeted to fit in the space available on a target chip. Typically, the electronic circuit design generator will store the data representing the I/Os and test logic circuitry on a machine-readable storage medium. The electronic circuit design generator then may provide the device layout (including the test circuit) to be used to generate one or more lithographic masks utilized in the fabrication of the device including the test circuit. The electronic circuit design generator may also provide a netlist for verification of the device and test circuit.

In block 510, the electronic circuit design generator may provide designs to simulate and verify the operation of the I/O circuits including their wrappers on chip or within the I/O ring. The machine may also generate simulations of representations of the circuits described above that can be functionally tested, timing tested, debugged and validated.

In block 515, the generated device layout may be integrated with the rest of the layout for the chip. Also, the machine may generate representations of the circuits described above for simulations, one or more lithographic masks for transferring the circuit design onto the chip during manufacture, or other similar useful derivations of the circuits described above. The machine-readable storage medium may store instruction on how to build a DIB. The machine-readable storage medium may also store instructions for a test generation program to generate instructions for the external tester, the I/O circuits, and the soft wrapper, to run the test sequences for the DC parameter tests, AC tests, and delay tests.

In block 520, a fabrication facility may fabricate one or more chips with the signal generation circuit utilizing the lithographic masks generated from the electronic circuit design generator's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, 65 nm or less, to fabricate the chips. The size of the CMOS logic process employed typically defines the smallest minimum lithographic dimension that can be fabricated on the chip using the lithographic masks, which in turn, determines minimum component size. According to one embodiment, light may pass through these lithographic masks onto the chip to transfer the circuit design and layout for the test circuit onto the chip itself. In one embodiment, the electronic circuit design generator is designed for embedded applications in a standard CMOS logic process.

Although a method embodiment has been described in reference to I/O tests, it could be applied to other types of applications.

In one embodiment, an electronic circuit design generator may be implemented in software as a set of data and instructions, such as a software cell library callable to other programs or an electronic circuit design generator consisting of an executable program with the software cell library in one program, stored on a machine-readable medium. A machine-readable storage medium may include any mechanism that provides (e.g., stores and/or transmits) information in a form readable by a machine (e.g., a computer). For example, a machine-readable medium may include, but is not limited to: read only memory (ROM); random access memory (RAM); magnetic disk storage media; optical storage media; flash memory devices; DVD's; electrical, optical, acoustical or other forms of propagated signals (e.g., carrier waves, infrared signals, digital signals); EPROMs; EEPROMs; FLASH, magnetic or optical cards; or any other type of media suitable for storing electronic instructions.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

Figure 6A:
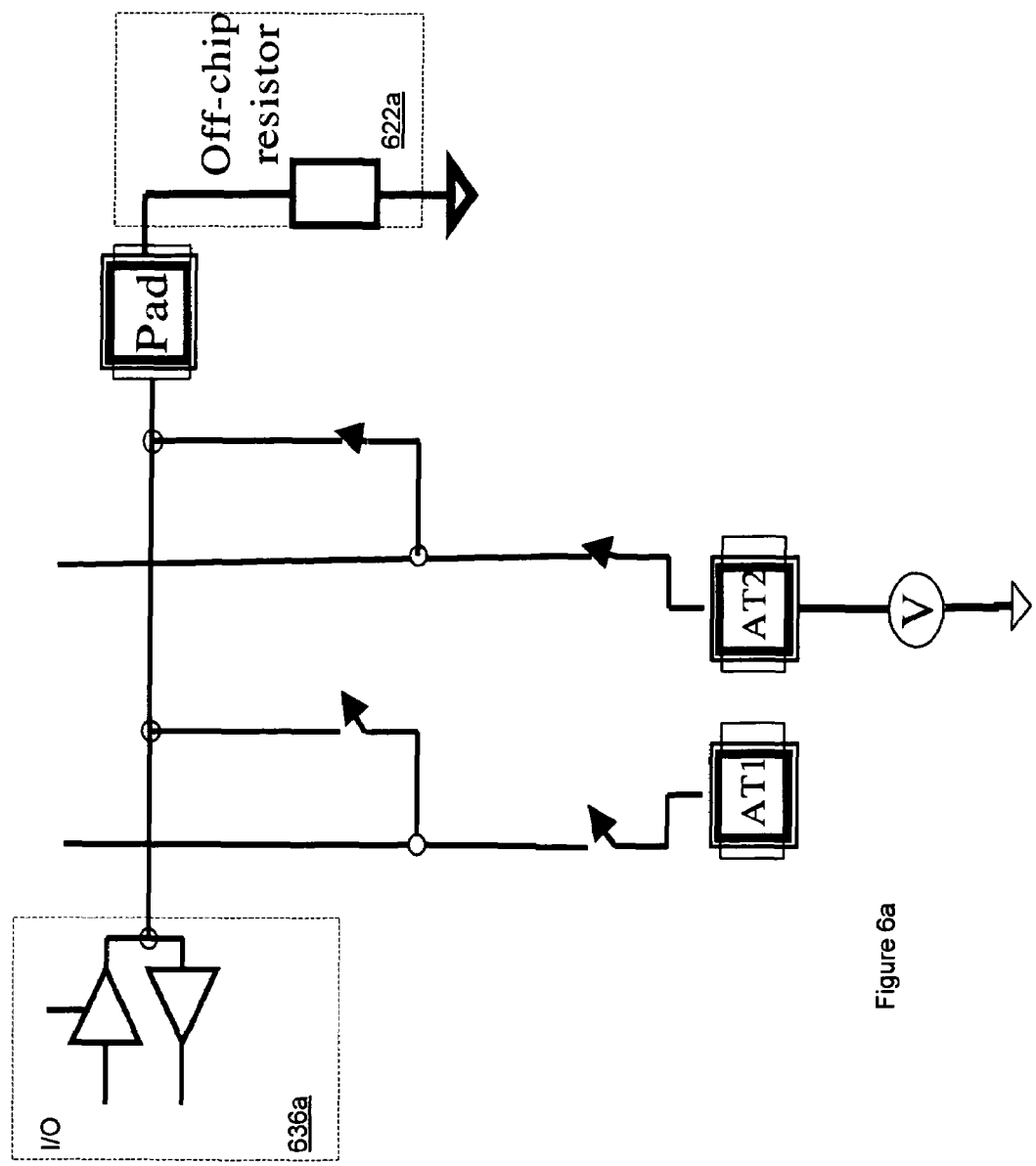
FIG. 6a illustrates a circuit diagram of an embodiment of an Input-Output (I/O) circuit connected to its own resistor to undergo a Direct Current (DC) voltage parameter test and 2) DC current parameter test.

FIG. 6a illustrates a circuit diagram of an embodiment of an Input-Output (I/O) circuit connected to its own resistor to under go a Direct Current (DC) voltage parameter test and 2) DC current parameter test. As discussed previously, the off chip resistor 622a may act as a nominal load or a buffer during the DC voltage parameter tests and) DC current parameter test. The pull up and pull down transistors in the I/O buffer 636a may receive enable signals from the soft wrapper.

Figure 6B:
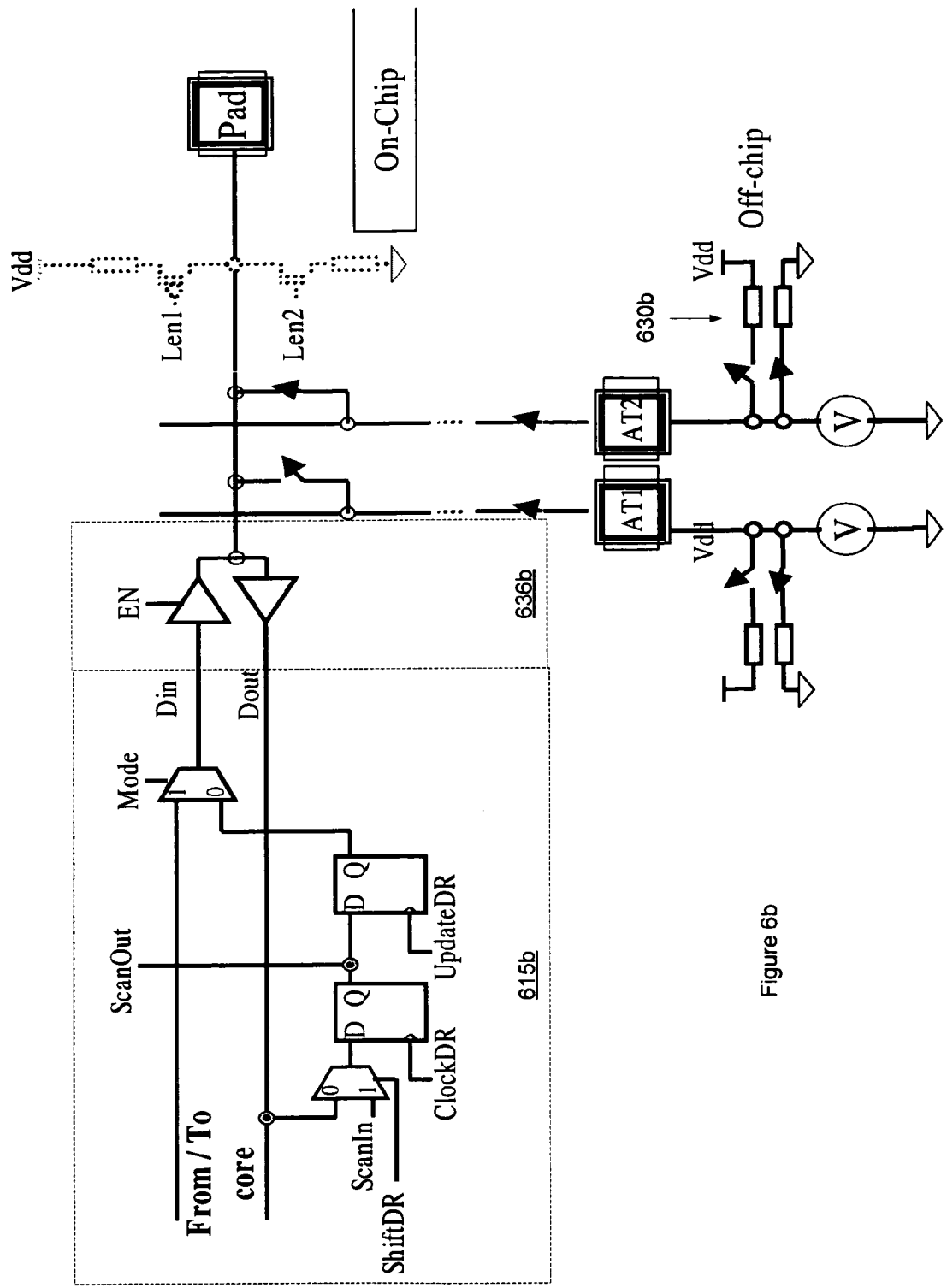
FIG. 6b also illustrates a circuit diagram of an embodiment of an Input-Output (I/O) circuit connected to its own resistor to under go a Direct Current (DC) voltage parameter test and 2) DC current parameter test.

FIG. 6b also illustrates a circuit diagram of an embodiment of an Input-Output (I/O) circuit connected to its own resistor to under go a Direct Current (DC) voltage parameter test and 2) DC current parameter test. The off chip resistors 622b may act as a nominal load or a buffer during the DC voltage parameter tests and) DC current parameter test. The pull up and pull down transistors in the I/O buffer 636b may receive enable signals from the soft wrapper. The soft wrapper circuit uses combinational logic to send control signals to enable as well as disable pull up and pull down transistors in the associated I/O circuit 636b.

Figure 6C:
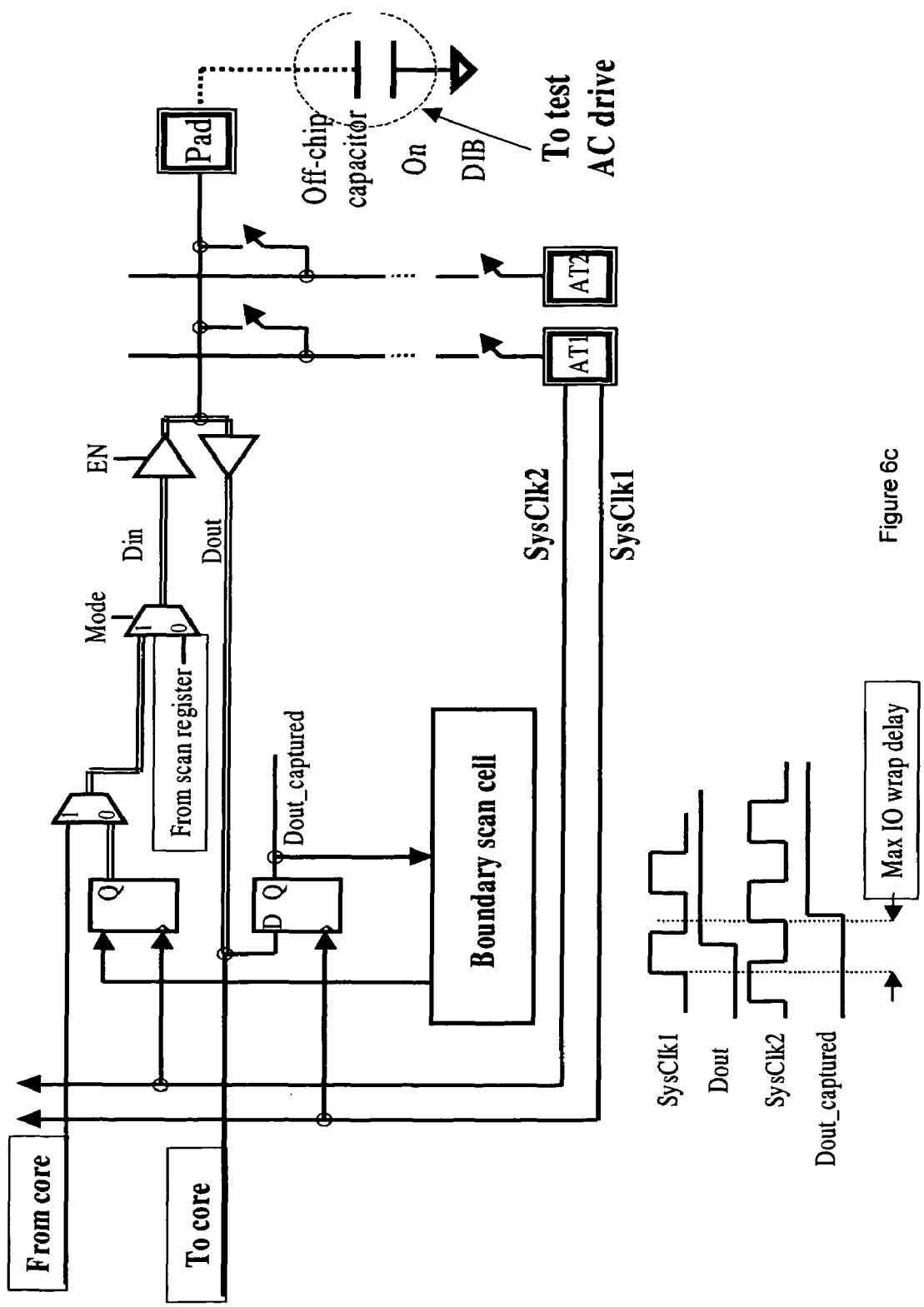
FIG. 6c illustrates a circuit diagram of an embodiment of an I/O circuit to undergo a delay parameter test.

FIG. 6c illustrates a circuit diagram of an embodiment of an I/O circuit to under go a delay parameter test. As discussed previously, the off chip capacitor may provide proper impedance to conduct the timing tests between the launch strobe and the capture strobe.

While some specific embodiments of the invention have been shown the invention is not to be limited to these embodiments. For example, most functions performed by electronic hardware components may be duplicated by software emulation. Thus, a software program written to accomplish those same functions may emulate the functionality of the hardware components in input-output circuitry. The invention is to be understood as not limited by the specific embodiments described herein, but only by scope of the appended claims.

What is claimed is:

1. An apparatus, comprising:
a device interface board having a first plurality of connection paths to connect two or more Input-Output (I/O) circuits in a first group of I/O circuits to a first pin on a tester that is external to a platform containing all of the I/O circuits, where the first pin to couple to a first Parametric Measurement Unit (PMU), wherein the first plurality of connection paths connects the two or more I/O circuits in the first group of I/O circuits to the first PMU via its own resistor and the device interface board has a switch to connect a terminal of all of the resistors coupled to their respective I/O circuit in the first group of I/O circuits to ground.

2. The apparatus of claim 1, further comprising:
a soft wrapper logic circuit configured to send control signals to enable both pull up and pull down transistors in a first I/O circuit in the first group of I/O circuits and to disable both the pull up and the pull down transistors in the first I/O circuit.

3. The apparatus of claim 2, wherein the soft wrapper logic circuit also is configured to issue commands to enable and disable an output voltage driver in the first I/O circuit.

4. The apparatus of claim 1, wherein a first I/O circuit in the first group of I/O circuits has logic configured to support an enable/disable feature for pull-up and pull-down transistors in that I/O circuit.

5. The apparatus of claim 1, wherein the device interface board further includes a plurality of capacitors and a first I/O circuit in the first group of I/O circuits is connected to its own resistor and its own capacitor on the device interface board.

6. The apparatus of claim 1, wherein the device interface board further includes a second plurality of connection paths to connect a second group of I/O circuits to a second pin on the tester associated with a second PMU, wherein the second plurality connection path to connect each I/O circuit in the second group of I/O circuits to the second PMU via its own resistor and the two or more resistors for the first group, each resistor associated with its own I/O circuit, connect to the first pin and the two or more resistors in the second group connect to the second pin.

7. A method, comprising:
performing at least one of 1) a Direct Current (DC) voltage parameter test and 2) DC current parameter test on each Input-Output (I/O) circuit in a group of I/O circuits connected through its own resistor to a first pin on an external test unit that executes a Parametric Measurement Unit (PMU) function, where a device interface board coupled to the external test unit has a switch to connect a terminal of all of the resistors coupled to their respective I/O circuit in a first group of I/O circuits to ground and the first group has two or more I/O circuits;
determining a DC output voltage level supplied from each I/O circuit in the group of I/O circuits, one I/O circuit at a time by enabling an output driver and a pull up transistor of an individual I/O circuit under test, and measuring a first amount of current flowing to the PMU from the individual I/O circuit under test, and
sequentially repeating this determining of DC output voltage level step for each remaining I/O circuit in the group.

8. The method of claim 7, further comprising:
disabling an output driver of every I/O circuit in the group of I/O circuits connected to the first pin;
disabling every I/O circuit's pull up and pull down transistors in the group of I/O circuits; and
determining total leakage current from the group of I/O circuits by forcing the first pin that connects the PMU to ground DC voltage potential and measuring a second amount of current flowing from the group of disabled I/O circuits to the PMU.

9. The method of claim 8, further comprising:
sequentially repeating this determining of DC output voltage level step for each remaining I/O circuit in the group after the below calibration step occurs for the individual I/O circuit under test;
calibrating the determined output DC voltage level supplied from the I/O circuit under test to account for leakage current by subtracting the measured second amount of total leakage current from the measured first amount of current from the individual I/O circuit under test and converting the remainder to a DC output voltage to determine the calibrated output DC voltage level supplied from that I/O circuit under test; and
sequentially testing each remaining I/O circuit in the group by disabling the pull up transistor and the output driver associated with the I/O circuit previously tested and enabling the pull up transistor and output driver of the I/O circuit to be tested.

10. The method of claim 7, further comprising:
performing a first Direct Current output voltage parameter test on a first I/O circuit in a first plurality of I/O circuits that includes the group of I/O circuits while in parallel performing a second output Direct Current voltage parameter test on a second I/O circuit in a second plurality of I/O circuits.

11. The method of claim 7, further comprising:
simultaneously performing an input DC voltage test on the group of I/O circuits connected to the first pin on the external test unit that supports the PMU function.

12. The method of claim 11, wherein the simultaneously performing of the input DC voltage test further includes
disabling an output driver of every I/O circuit in the group of I/O circuits connected to the first pin;
forcing the first pin that supports the PMU to a first input DC voltage potential for all of the I/O circuits in the group of I/O circuits connected to the first pin; and
analyzing test results for all of the I/O circuits in the group that are of a same type and have a substantially similar input DC voltage threshold value by comparing captured logic results of each I/O circuit having the same type and similar input DC voltage threshold to expected results.

13. The method of claim 12, further comprising:
repeating the above steps for other types of I/O circuits in the group of I/O circuits connected to the first pin that has a different input DC voltage threshold by forcing the first pin that supports the PMU to a second input DC voltage potential rather than the first input DC voltage potential.

14. The method of claim 11, further comprising:
disabling every I/O circuit's pull up and pull down transistors in the group of I/O circuits;
forming all of the I/O circuits in the group into one or more sub groups, where each group contains I/O circuits that have a same type and have a substantially similar input DC voltage threshold value;
forcing the first pin that supports the PMU to a first input DC voltage potential for all of the I/O circuits in a first sub group; determining a calibrated first input DC voltage potential for all of the I/O circuits in the first sub group by increasing the first input DC voltage potential by a first voltage drop amount across a first resistor between a first I/O circuit in the first subgroup and the first pin;
forcing the first pin that supports the PMU to the calibrated first input DC voltage potential for all of the I/O circuits in the first sub group; and
storing test results from the applied calibrated first input DC voltage potential for all of the I/O circuits in the first sub group.

15. The method of claim 14, further comprising:
forcing the first pin that supports the PMU to a second input DC voltage potential for all of the I/O circuits in a second sub group;
generating a calibrated second input DC voltage potential for all of the I/O circuits in the second sub group by increasing the second input DC voltage potential by a second voltage drop amount across a second resistor between a second I/O circuit in the second sub group and the first pin;
forcing the first pin that supports the PMU to the calibrated second input DC voltage potential for all of the I/O circuits in the second sub group; and
storing test results from the applied calibrated second input DC voltage potential for all of the I/O circuits in the second sub group.

16. The method of claim 7, further comprising:
performing also a delay parameter test on each I/O circuit in the group of I/O circuits, all of the I/O circuits at the same time.

17. A machine-readable medium that stores instructions, which when executed by the machine, to generate an instance to perform the method of claim 7.

18. A machine-readable medium that stores instructions, which when executed by the machine, to generate instructions for a tester, the I/O circuits, and a soft wrapper, to run test sequences recited in the method of claim 7.

19. A machine-readable medium that stores instructions, which when executed by the machine, to generate instructions for a tester, the I/O circuits, and a soft wrapper, to run test sequences recited in the method of claim 11.

20. A machine-readable medium that stores instructions, which when executed by the machine, to generate an instance to perform the method of claim 11.

21. An apparatus, comprising:
a first plurality of Input-Output (I/O) circuits connectable via one or more resistors to a first pin on a tester that is external to the apparatus containing all of the I/O circuits, where the first pin is to couple to a first Parametric Measurement Unit (PMU), wherein a switch connects a terminal to ground for of all of the resistors coupled to their respective I/O circuit in the first plurality of I/O circuits; and
a soft wrapper circuit coupled to the first plurality of I/O circuits, wherein the soft wrapper circuit has logic configured to send control signals to enable as well as disable pull up and pull down transistors in the first plurality of I/O circuits.

22. The apparatus of claim 21, wherein the soft wrapper circuit has additional logic configured to send control signals for performing an input Direct Current (DC) voltage parameter test simultaneously on each I/O circuit in the first plurality of I/O circuits, and the soft wrapper circuit has additional logic configured to compensate the input DC voltage parameter test based on leakage current from the first plurality of I/O circuits.

23. The apparatus of claim 21, wherein the soft wrapper circuit has additional logic configured to send control signals to perform an output Direct Current (DC) voltage parameter test on each I/O circuit in the first plurality of I/O circuits by
determining total leakage current from the first plurality of I/O circuits connected to the first pin on the external test unit that supports the PMU function,
determining a DC output voltage level supplied from each I/O circuit in the first plurality of I/O circuits, one I/O circuit at a time, and
calibrating the determined output DC voltage level supplied from each I/O circuit under test.

24. A machine-readable medium that stores instructions, which when executed by the machine, to cause the machine to generate a representation of the apparatus of claim 21.

* * * * *